United States Patent
Chiang et al.

(10) Patent No.: US 10,867,867 B2
(45) Date of Patent: Dec. 15, 2020

(54) METHODS OF FABRICATING SEMICONDUCTOR DEVICES WITH MIXED THRESHOLD VOLTAGES BOUNDARY ISOLATION OF MULTIPLE GATES AND STRUCTURES FORMED THEREBY

(71) Applicant: TAIWAN SEMICONDUCTOR MANUFACTURING CO., LTD., Hsinchu (TW)

(72) Inventors: Kuo-Cheng Chiang, Zhubei (TW); Chung-Wei Hsu, Hsinchu County (TW); Lung-Kun Chu, New Taipei (TW); Jia-Ni Yu, New Taipei (TW); Chih-Hao Wang, Baoshan Township, Hsinchu County (TW); Mao-Lin Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/353,012

(22) Filed: Mar. 14, 2019

(65) Prior Publication Data

US 2020/0294863 A1    Sep. 17, 2020

(51) Int. Cl.
*H01L 21/8238* (2006.01)
*H01L 29/06* (2006.01)
(Continued)

(52) U.S. Cl.
CPC .. *H01L 21/823807* (2013.01); *H01L 21/0337* (2013.01); *H01L 21/28088* (2013.01); *H01L 21/3086* (2013.01); *H01L 21/823821* (2013.01); *H01L 21/823828* (2013.01); *H01L 21/823864* (2013.01); *H01L 21/823878* (2013.01); *H01L 27/0924* (2013.01); *H01L 29/0649* (2013.01); *H01L 29/0673* (2013.01); *H01L 29/4966* (2013.01); *H01L 29/6681* (2013.01);
(Continued)

(58) Field of Classification Search
CPC ........... H01L 21/0337; H01L 21/28088; H01L 21/3086; H01L 21/823821; H01L 21/823828; H01L 21/823864; H01L 27/0924
USPC .................................................. 438/199, 207
See application file for complete search history.

(56) References Cited

U.S. PATENT DOCUMENTS 9,209,247 B2    12/2015    Colinge et al.
9,236,267 B2    1/2016    De et al.
(Continued)

*Primary Examiner* — Tan N Tran
(74) *Attorney, Agent, or Firm* — Birch, Stewart, Kolasch & Birch, LLP

(57) ABSTRACT

A method of fabricating semiconductor devices includes forming a plurality of first and second nanosheets in p-type and n-type device regions, respectively. A p-type work function (PWF) layer is deposited to surround each of the first and second nanosheets. A first mask is formed on the PWF layer and not over the boundary between the p-type and n-type device regions, and then the PWF layer is etched in a first etching process to keep portions of the PWF layer between the second nanosheets. A second mask is formed on the PWF layer, and then the portions of the PWF layer between the second nanosheets are removed in a second etching process. An n-type work function layer is deposited in the n-type and the p-type device regions to surround each of the second nanosheets and on the PWF layer.

20 Claims, 38 Drawing Sheets

(51) Int. Cl.
   *H01L 29/66* (2006.01)
   *H01L 29/49* (2006.01)
   *H01L 27/092* (2006.01)
   *H01L 21/308* (2006.01)
   *H01L 21/033* (2006.01)
   *H01L 21/28* (2006.01)
   *H01L 29/78* (2006.01)

(52) U.S. Cl.
   CPC ...... *H01L 29/66545* (2013.01); *H01L 29/785* (2013.01); *H01L 2029/7858* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2018/0308768 A1* | 10/2018 | Mochizuki ........ H01L 29/42392 |

* cited by examiner

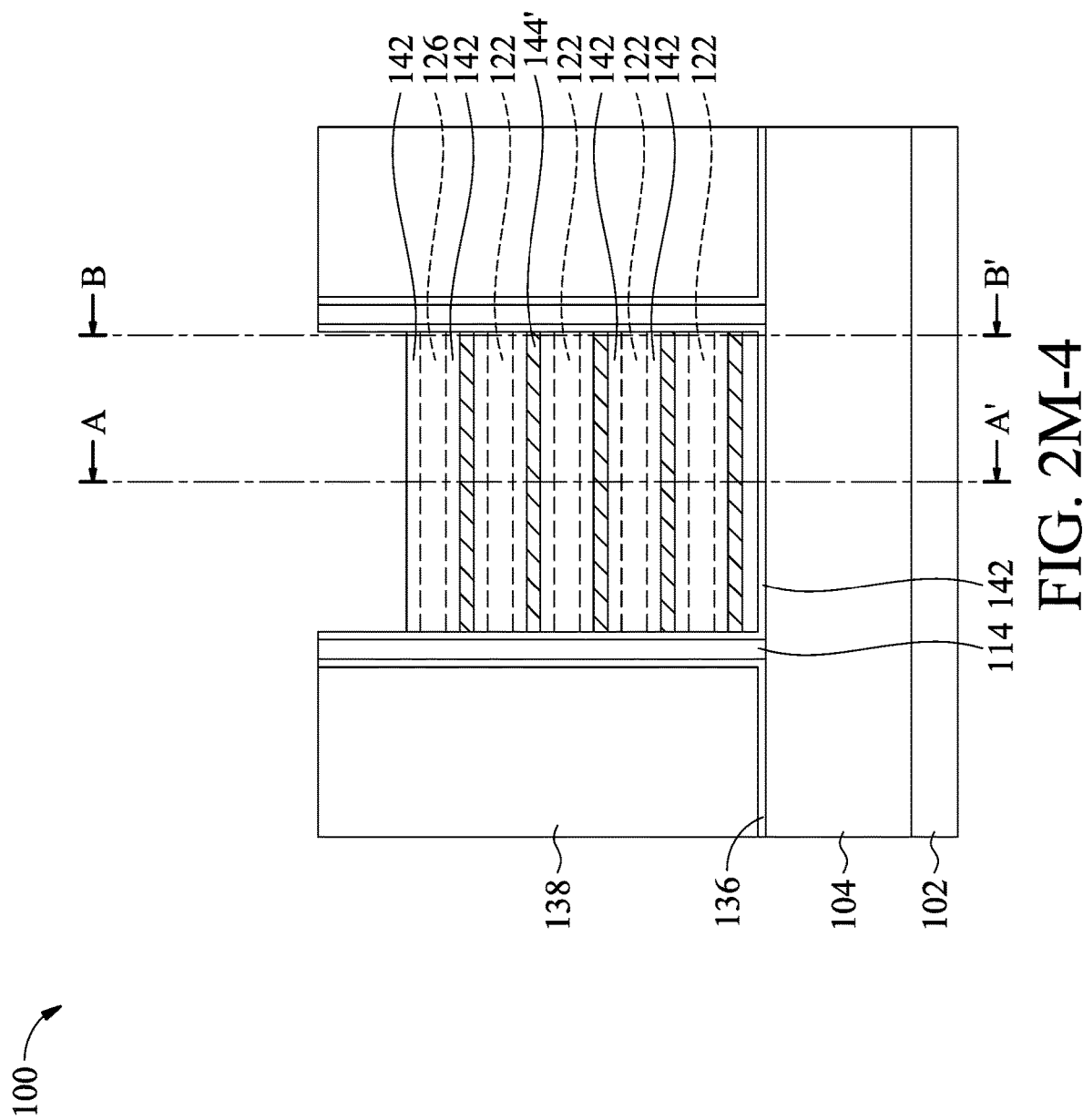

METHODS OF FABRICATING SEMICONDUCTOR DEVICES WITH MIXED THRESHOLD VOLTAGES BOUNDARY ISOLATION OF MULTIPLE GATES AND STRUCTURES FORMED THEREBY

BACKGROUND

The semiconductor integrated circuit (IC) industry has experienced exponential growth. Technological advances in IC materials and design have produced generations of ICs where each generation has smaller and more complex circuits than the previous generation. As the semiconductor IC industry has progressed into nanometer process nodes in pursuit of higher device density, higher performance, and lower costs, challenges from both fabrication and design issues have resulted in the development of three-dimensional designs, such as a Fin Field Effect Transistor (FinFET).

FinFET devices typically include semiconductor fins with high aspect ratios. A gate structure is formed over and along the sides of the fin (e.g., wrapping) utilizing the advantage of the increased surface area of the channel to produce faster, more reliable, and better-controlled semiconductor transistor devices. However, since device feature sizes continue to decrease, fabrication processes continue to become more difficult to perform. There are still various challenges in the fabrication of FinFET devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2E, 2F, 2G, 2H, 2I, 2J-1 and 2R-2 show cross-sectional views of respective structures at various stages of an exemplary method for fabricating a semiconductor device taken along line II-II' in FIG. 1, in accordance with some embodiments.

FIGS. 2J-2, 2K-1, 2L-1, 2M-1, 2N-1, 2O-1, 2P-1, 2Q-1 and 2R-1 show cross-sectional views of respective structures at various stages of an exemplary method for fabricating a semiconductor device taken along line A-A' in FIG. 1, in accordance with some embodiments.

FIGS. 2K-2, 2L-2, 2M-2, 2N-2, 2O-2, 2P-2 and 2Q-2 show cross-sectional views of respective structures at various stages of an exemplary method for fabricating a semiconductor device taken along line B-B' in FIG. 1, in accordance with some embodiments.

FIGS. 2K-3, 2L-3, 2M-3, 2N-3, 2O-3 and 2P-3 show perspective views of respective structures at several stages of an exemplary method for fabricating a semiconductor device, in accordance with some embodiments.

FIGS. 2K-4, 2L-4, 2M-4 and 2O-4 show front views of respective structures at several stage of an exemplary method for fabricating a semiconductor device, in accordance with some embodiments.

DETAILED DESCRIPTION

Figure 1:
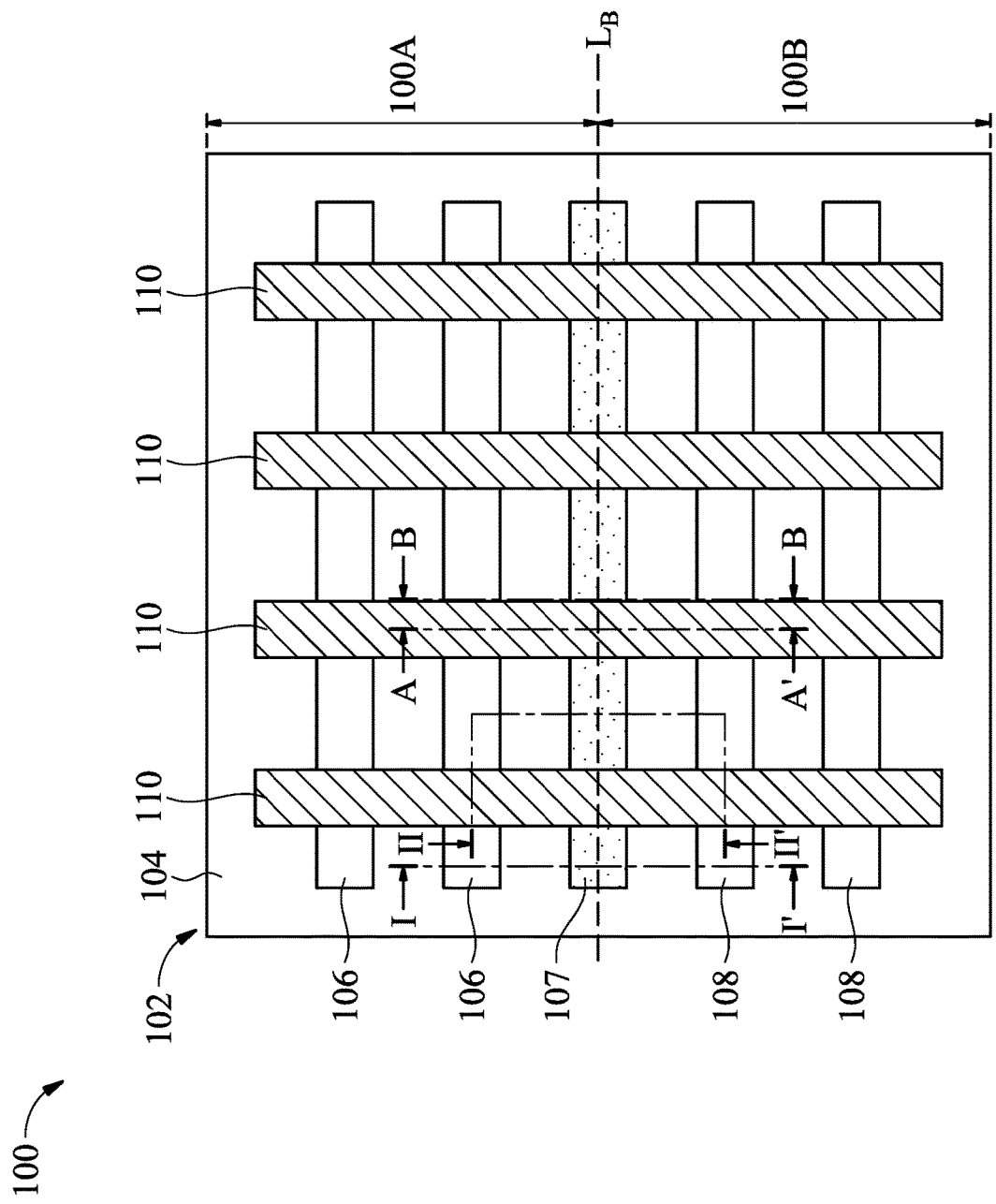
FIG. 1 shows a plane view of an intermediate structure at one stage of an exemplary method for fabricating a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

For advanced technology of semiconductor devices, multiple threshold voltages (Vts) for device function flexibility become more and more important. However, multiple patterning gates (MPGs) to enable multiple Vts face difficulties because of shrinkage of device dimension. Multiple Vts are arranged one next to another in various regions of a semiconductor device and may be referred to as mixed Vts. When a wet over etching is applied to ensure complete removal of gate material in one region, the gate material in another neighboring region may suffer loss and a patterning boundary is thereby varied. There are challenges in fabrication of MPGs having mixed Vts, especially in advanced semiconductor devices such as Fin Field Effect Transistor (FinFET) devices with nanowires or nanosheets for GAA structures at technology nodes of 3 nm (N3) and below.

Embodiments disclosed herein relate generally to fabricating semiconductor devices with mixed threshold voltages (Vts) boundary isolation of multiple patterning gates and structures formed thereby. The embodiments of the disclosure provide a two-step patterning process and a two-step wet etching process to produce mixed Vts boundary isolation of multiple patterning gates. The two-step patterning process uses a first patterned mask inside an N/P boundary between a p-type device region and an n-type device region, and a second patterned mask outside the N/P boundary. The two-step wet etching process uses different etching amounts to remove a p-type work function layer in the n-type device region without metal gate material loss. The embodiments of the disclosure can avoid metal gate material loss and prevent from metal gate retreat along the N/P boundary. Therefore, the embodiments of the disclosure can achieve high Vt in the p-type device region, better Vt control in terms of Vt level and uniformity for semiconductor devices such as FinFET devices with nanowires or nanosheets for multiple GAA structures having mixed Vts at technology nodes of N3 and below. Moreover, cell height budget of the semiconductor devices can be saved due to minimized lateral material loss of metal gate.

The foregoing broadly outlines some aspects of the embodiments described herein. Some embodiments described herein are described in the context of FinFET devices, and more particularly, in the context of forming mixed Vts boundary isolation of multiple patterning gates for FinFET devices with GAA structures. The GAA structures in the p-type and n-type device regions are formed using the two-step patterning process and the two-step wet etching process. Some variations of the exemplary methods and structures are described. A person having ordinary skill in the art will readily understand other modifications may be made that are contemplated within the scope of other embodiments. Implementations of some aspects of the present disclosure may be used in other processes and/or in other devices. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 illustrates a plane view of an intermediate structure at one stage of an exemplary method for fabricating a semiconductor device 100 such as a FinFET device, in accordance with some embodiments. At the stage, the semiconductor device 100 includes multiple dummy gate structures 110 formed on and across multiple fin structures 106 in a p-type device region such as a p-type metal-oxide-semiconductor (PMOS) region 100A and multiple fin structures 108 in an n-type device region such as an n-type metal-oxide-semiconductor (NMOS) region 100B. An isolation structure 107 is disposed at the boundary $L_B$ between the PMOS region 100A and the NMOS region 100B. Moreover, the isolation structure 107 is disposed between the fin structures 106 in the PMOS region 100A and the fin structures 108 in the NMOS region 100B. Each of the fin structures 106 and 108 is surrounded and isolated by another isolation structure such as a shallow-trench-isolation (STI) structure 104. The fin structures 106 and 108, the isolation structure 107, the dummy gate structures 110 and the STI structure 104 are formed on a substrate 102. Other aspects not illustrated in or described with respect to FIG. 1 may become apparent from the following figures and description. The structure in FIG. 1 may be electrically connected or coupled in a manner to operate one or more transistors, for example eight transistors in each of the PMOS region 100A and the NMOS region 100B.

Figure 2A:
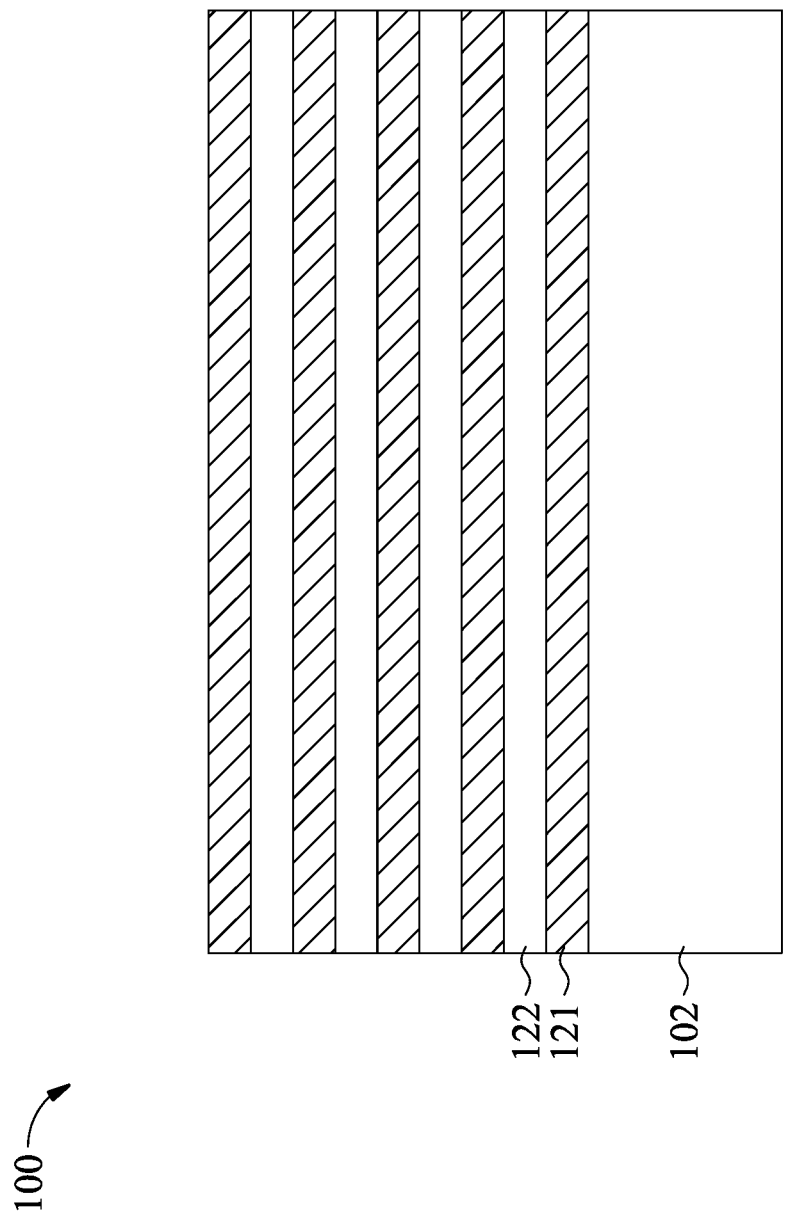
FIGS. 2A, 2B, 2C and 2D show cross-sectional views of respective structures at various stages of an exemplary method for fabricating a semiconductor device taken along line I-I' in FIG. 1, in accordance with some embodiments.

FIGS. 2A, 2B, 2C and 2D show cross-sectional views of respective structures at various stages of an exemplary method for fabricating the semiconductor device 100 taken along line I-I' in FIG. 1, in accordance with some embodiments. Line I-I' is on a plane that is parallel to the dummy gate structures 110 and across the fin structure 106, the isolation structure 107 and the fin structure 108. Referring to FIG. 2A, firstly, a stack of alternating semiconductor layers 121 and 122 are blanketly deposited on the substrate 102, in accordance with some embodiments.

The substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate 102 may be made of silicon or another semiconductor material. For example, the substrate 102 is a silicon wafer. In some examples, the substrate 102 is made of a compound semiconductor such as silicon germanium (SiGe), silicon carbide (SiC), gallium arsenic (GaAs), indium arsenide (InAs), or indium phosphide (InP). In some examples, the substrate 102 is made of an alloy semiconductor such as GaAsP, AlInAs, AlGaAs, GaInAs, GaInP, or GaInAsP.

The semiconductor layers 121 and 122 are made of different materials such as silicon, germanium, silicon germanium (SiGe), gallium arsenic (GaAs), indium arsenide (InAs), silicon carbide (SiC) or InGaAs. In some embodiments, the semiconductor layers 121 are made of SiGe, and the semiconductor layers 122 are made of Si. The semiconductor layer 121 may be firstly deposited on the substrate 102. Alternatively, the semiconductor layer 122 may be firstly formed on the substrate 102. The semiconductor layers 121 and 122 are alternately formed on the substrate 102 by different epitaxial growth processes. In some examples, the total number of layers in the stack of semiconductor layers 121 and 122 is between three and ten. For example, there may be nine layers. In some examples, the total thickness of the stacked semiconductor layers 121 and 122 is in a range from about 45 nm to about 90 nm.

Figure 2B:
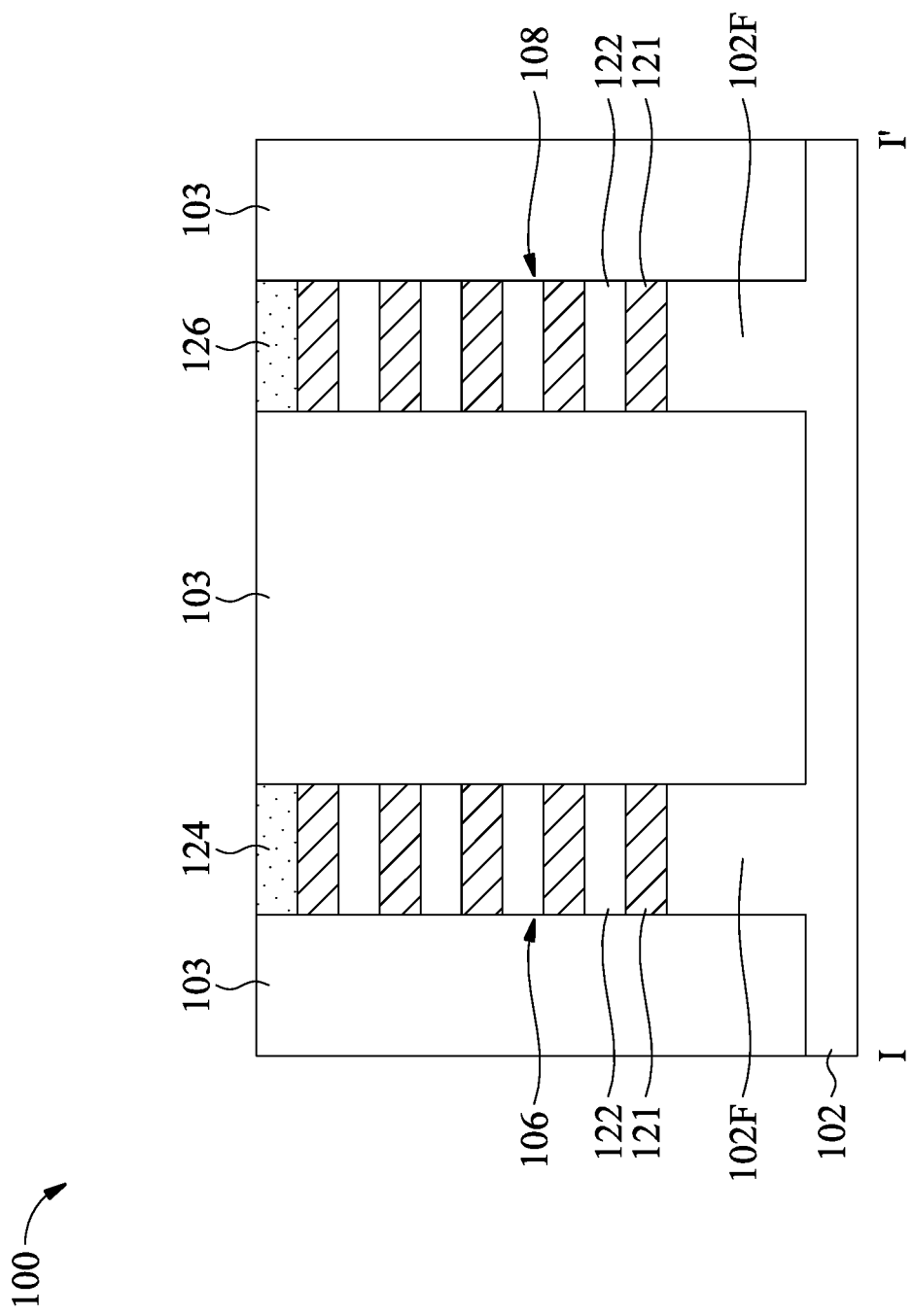

Afterwards, referring to FIG. 2B, the substrate 102 and the stacked semiconductor layers 121 and 122 are patterned together using an etching process to form the fin structures 106 in the PMOS region 100A and the fin structures 108 in the NMOS region 100B, in accordance with some embodiments. The etching process may include a reactive ion etch (RIE), neutral beam etch (NBE), inductive coupled plasma (ICP) etch, or a combination thereof. A first hard mask 124 is formed over the stacked semiconductor layers 121 and 122 in the PMOS region 100A to serve as an etching mask for forming the fin structures 106. A second hard mask 126 is formed over the stacked semiconductor layers 121 and 122 in the NMOS region 100B to serve as an etching mask for forming the fin structures 108. The materials of the first and second hard masks 124 and 126 may be silicon nitride (SiN), silicon carbon nitride (SiCN), silicon oxycarbide (SiOC), silicon oxycarbon nitride (SiOCN) or a combination thereof. The first and second hard masks 124 and 126 may be formed together using deposition, photolithography and etching processes. Each of the fin structures 106 and 108 includes a fin base 102F and a fin stack on the fin base 102F. The fin base 102F is formed from the substrate 102. The fin stack is formed from the stacked semiconductor layers 121 and 122.

In addition, multiple trenches are formed in the substrate 102 and in the stacked semiconductor layers 121 and 122. Each of the trenches is between neighboring pairs of fin structures 106 or 108, or neighboring fin structures 106 and 108. Next, the trenches are filled with an insulating material 103. The insulating material 103 is such as silicon oxide, silicon nitride, silicon oxynitride, fluoride-doped silicate glass (FSG), or another low dielectric constant (low-k) dielectric material. The trenches may be filled with the insulating material 103 using a deposition process, such as chemical vapor deposition (CVD), flowable CVD (FCVD), a spin-on-glass (SOG) process, or another applicable process. After the deposition process, a planarization process such as a chemical mechanical polishing (CMP) process is performed on the deposited insulating material 103 and then the insulating material 103 may be coplanar with the first and second hard masks 124 and 126.

Figure 2C:
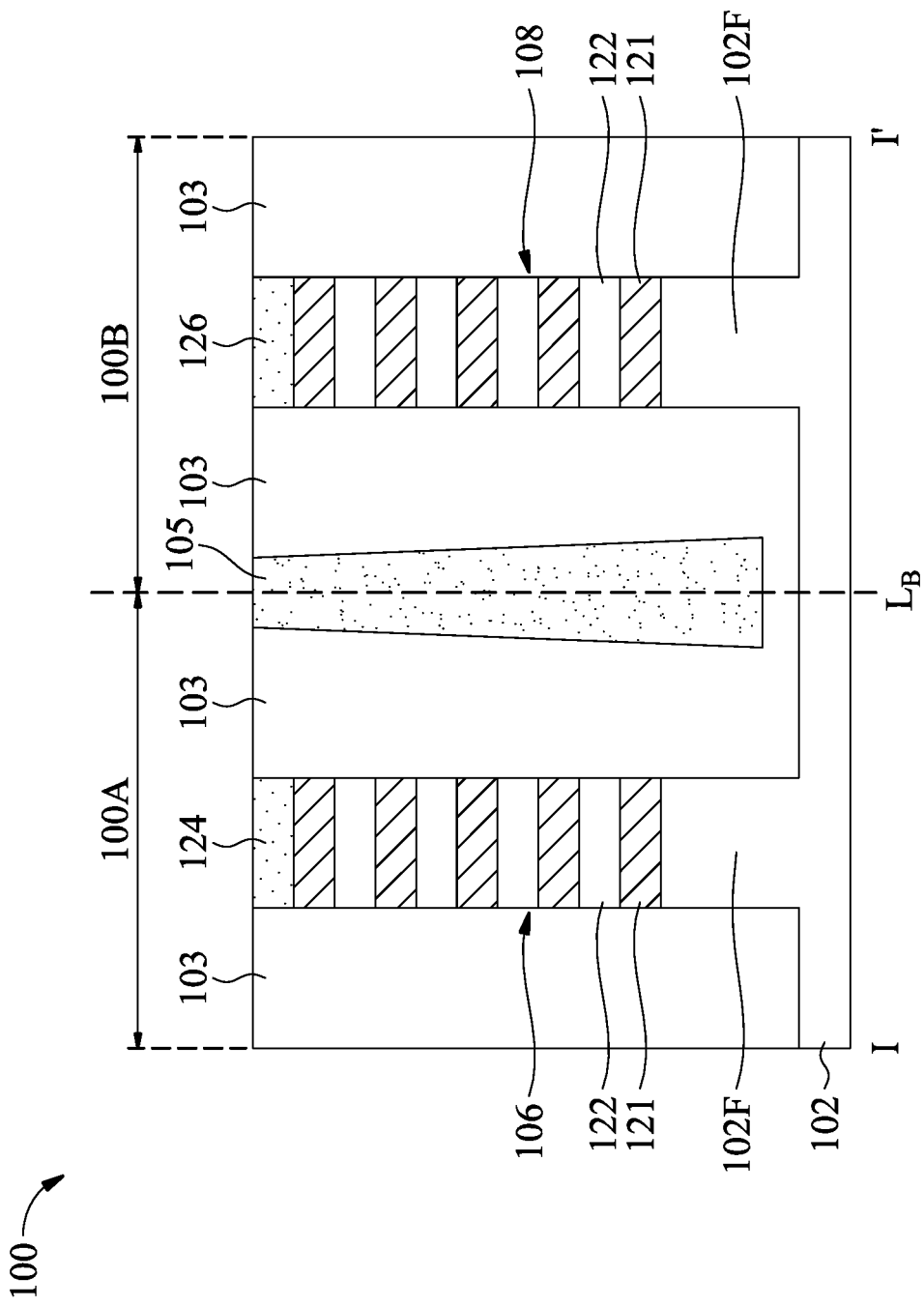

Next, referring to FIG. 2C, a trench is formed in the insulating material 103 between the neighboring fin structures 106 and 108 at the boundary $L_B$ between the PMOS region 100A and the NMOS region 100B, in accordance with some embodiments. The trench is formed by photolithography and etching processes. The bottom surface of the trench may be higher than or level with the bottom surface of the insulating material 103. The trench is filled with a dielectric material 105 such as a low-k dielectric material having a k-value lower than 7.0. In some embodiments, the dielectric material 105 is silicon nitride (SiN), silicon carbon nitride (SiCN), silicon oxycarbide (SiOC), silicon oxycarbon nitride (SiOCN) or a combination thereof. The trench is filled with the dielectric material 105 using a deposition process, such as CVD, FCVD, SOG, or another applicable process and then a planarization process such as a CMP process is performed on the deposited dielectric material 105. After the planarization process, the dielectric material 105, the insulating material 103 and the first and second hard masks 124 and 126 may have coplanar top surfaces.

Figure 2D:
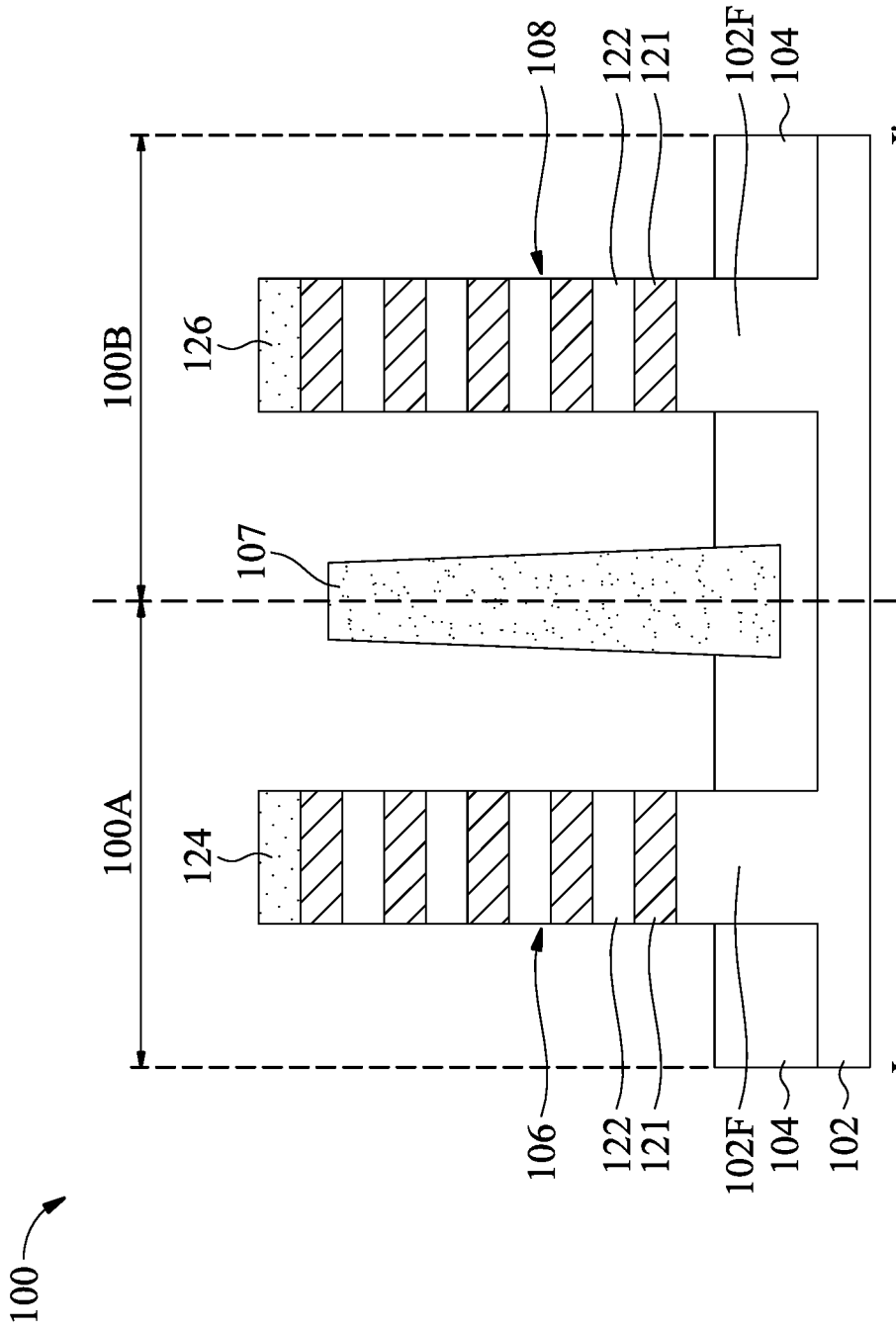

Afterwards, referring to FIG. 2D, the insulating material 103 in the trenches between the fin structures 106 and 108 is recessed by an etching process to form the STI structure 104, in accordance with some embodiments. The top surface of the STI structure 104 may be lower than or level with that the top surface of the fin base 102F. In addition, a top portion of the dielectric material 105 may be slightly removed by the etching process to form the isolation structure 107. The top surface of the isolation structure 107 may be lower than, higher than or level with the bottom surfaces of the first and second hard masks 124 and 126. The etching process includes RIE, NBE or another suitable etching process.

In addition, a liner (not shown) may be conformally formed between the isolation structure 104 and the substrate 102, and also between the isolation structure 104 and the fin bases 102F. The material layer for forming the liner is conformally deposited on the top surfaces and the sidewalls of the fin structures 106 and 108, and on the substrate 102 before filling the trenches with the insulating material 103. The material of the liner may be silicon oxide, silicon nitride or silicon oxynitride. The material layer of the liner may be deposited using CVD, physical vapor deposition (PVD) or atomic layer deposition (ALD) process. The material layer of the liner is recessed together with the filled insulating material 103 of the isolation structure 104 by an etching process to form the liner.

Figure 2E:
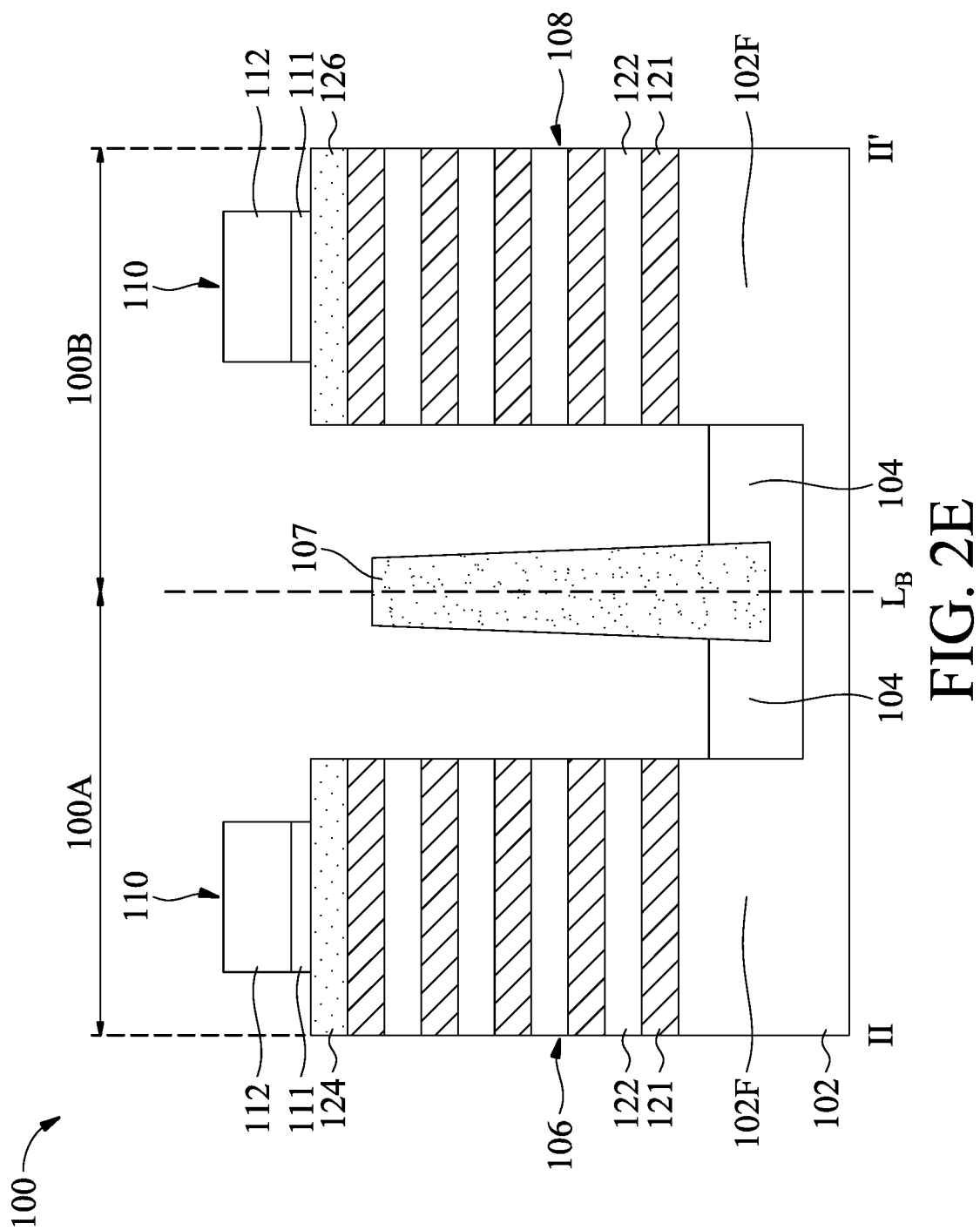

Afterwards, FIGS. 2E, 2F, 2G, 2H, 2I and 2J-1 show cross-sectional views of respective structures at various subsequent stages of an exemplary method for fabricating the semiconductor device 100 taken along line II-II' in FIG. 1, in accordance with some embodiments. Line II-II' is on a plane that is along the fin structure 106, across the isolation structure 107 and along the fin structure 108, and also across two portions of the dummy gate structure 110 in the PMOS region 100A and the NMOS region 100B, respectively. Referring to FIG. 2E, the dummy gate structures 110 are formed on the fin structures 106 and 108, in accordance with some embodiments. Although not shown in FIG. 2E, the dummy gate structure 110 is also formed across the fin structures 106 and 108 and the isolation structure 107, along the sidewalls and over the top surfaces of the fin structures 106 and 108 and the isolation structure 107. In addition, the dummy gate structure 110 is formed on the isolation structure 104. The longitudinal direction of the dummy gate structure 110 is perpendicular to the longitudinal direction of the fin structures 106 and 108 and the isolation structure 107. According to the embodiments of the disclosure, each of the dummy gate structures 110 will be replaced with a replacement gate structure in a gate-last process to form gate-all-around (GAA) structures without metal gate material loss and having excellent mixed Vts boundary isolation for multiple patterning gates in the PMOS region 100A and the NMOS region 100B. The materials and processes of forming the GAA structures in the PMOS region 100A and the NMOS region 100B would be described with reference to FIGS. 2J-1 to 2R-2.

Each of the dummy gate structures 110 includes a dummy gate dielectric layer 111 and a dummy gate electrode layer 112 on the dummy gate dielectric layer 110. In some embodiments, the dummy gate electrode layer 112 is made of poly-silicon. The dummy gate dielectric layer 111 may be made of silicon oxide, silicon nitride, silicon oxynitride or another low dielectric constant (low-k) dielectric material. The dummy gate dielectric layer 111 and the dummy gate electrode layer 112 are deposited independently and then may be patterned together using photolithography and etching processes to from the dummy gate structures 110. The deposition processes for the dummy gate dielectric layer 111 and the dummy gate electrode layer 112 may include CVD, PVD, ALD, high density plasma CVD (HDPCVD), metal organic CVD (MOCVD), or plasma enhanced CVD (PECVD) process. The etching processes for forming the dummy gate structures 110 may include RIE, NBE or another suitable etching process. In addition, a hard mask (not shown) is formed on the dummy gate electrode layer 112 to serve as an etching mask for forming the dummy gate structures 110.

Figure 2F:
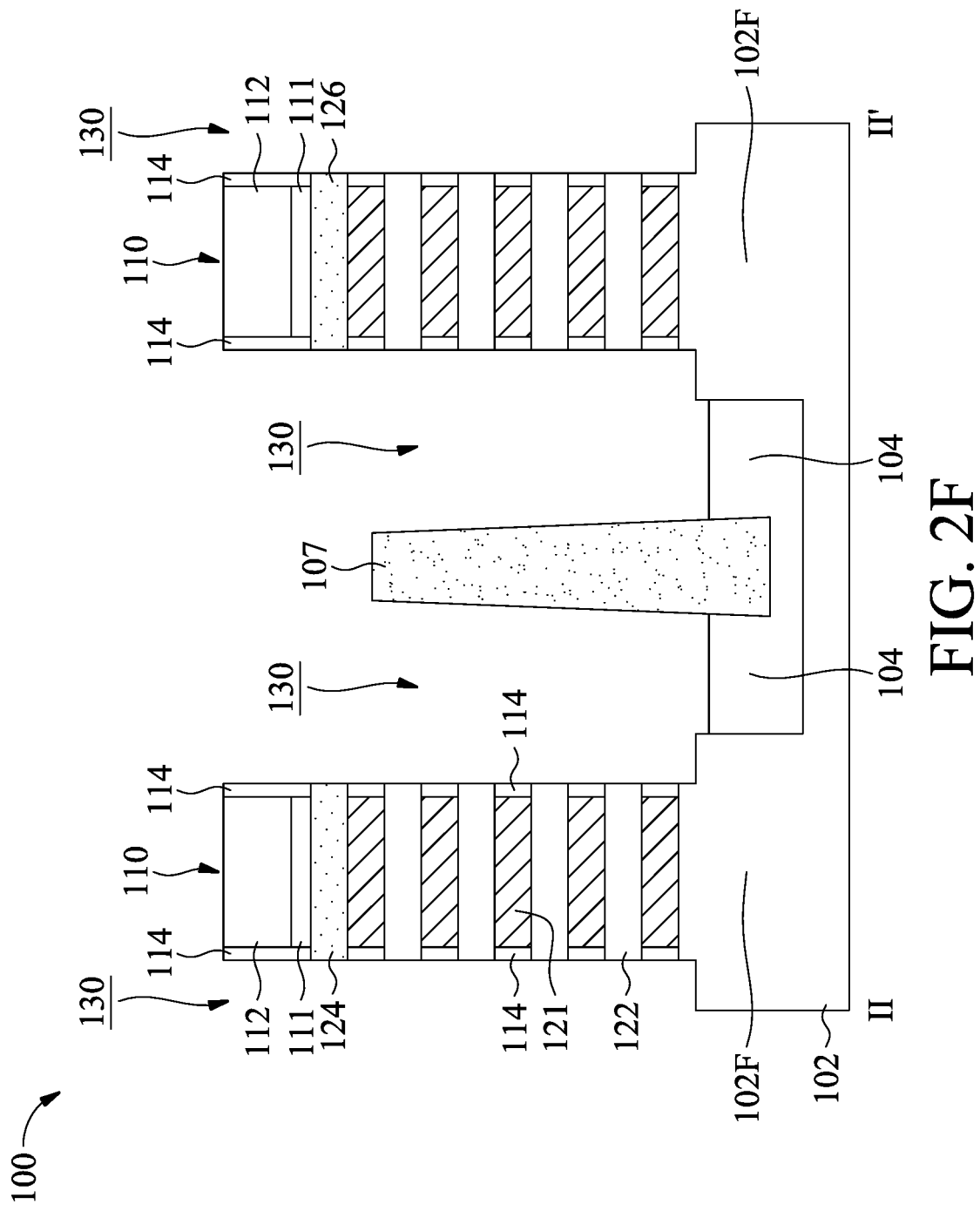

Next, referring to FIG. 2F, gate spacers 114 are formed along the sidewalls of the dummy gate structures 110, in accordance with some embodiments. In addition, the gate spacers 114 are also formed on the sidewalls of etched semiconductor layers 121. In some embodiments, firstly, the semiconductor layers 121 of the fin structures 106 and 108 at source and drain regions are etched using the dummy gate structures 110 as etching mask in an etching process such as plasma etching, RIE or another dry etching process. Next, the gate spacers 114 may be formed by conformally depositing one or more spacer material layers on the dummy gate structures 110, along the sidewalls of the dummy gate structures 110 and the etched semiconductor layers 121, on the fin base 102F and on the isolation structures 104. The spacer material layers may be made of different materials and have different thicknesses from each other. The one or more spacer material layers may include $SiO_2$, SiN, SiON, SiCN or a combination thereof, and may be deposited by CVD, ALD or another deposition process. The spacer material layers are then anisotropically etched to form the gate spacers 114. The etching process may include a RIE, NBE, or another etching process.

Afterwards, the first hard mask 124 and the semiconductor layers 122 of the fin structure 106 at the source and drain regions and the second hard mask 126 and the semiconductor layers 122 of the fin structure 108 at the source and drain regions are etched using the dummy gate structure 110 and the gate spacers 114 as an etching mask to form recesses 130. The recesses 130 may be formed using an isotropic etching process such as plasma etching, RIE or another dry etching process. Alternatively, the isotropic etching process may be a wet etching process that uses an etchant solution such as ammonium hydroxide-peroxide water mixture (APM), tetramethylammonium hydroxide (TMAH), ammonium hydroxide ($NH_4OH$), or another etchant. The bottom surfaces of the recesses 130 may be level with or lower than the top surface of the fin base 102F.

Figure 2G:
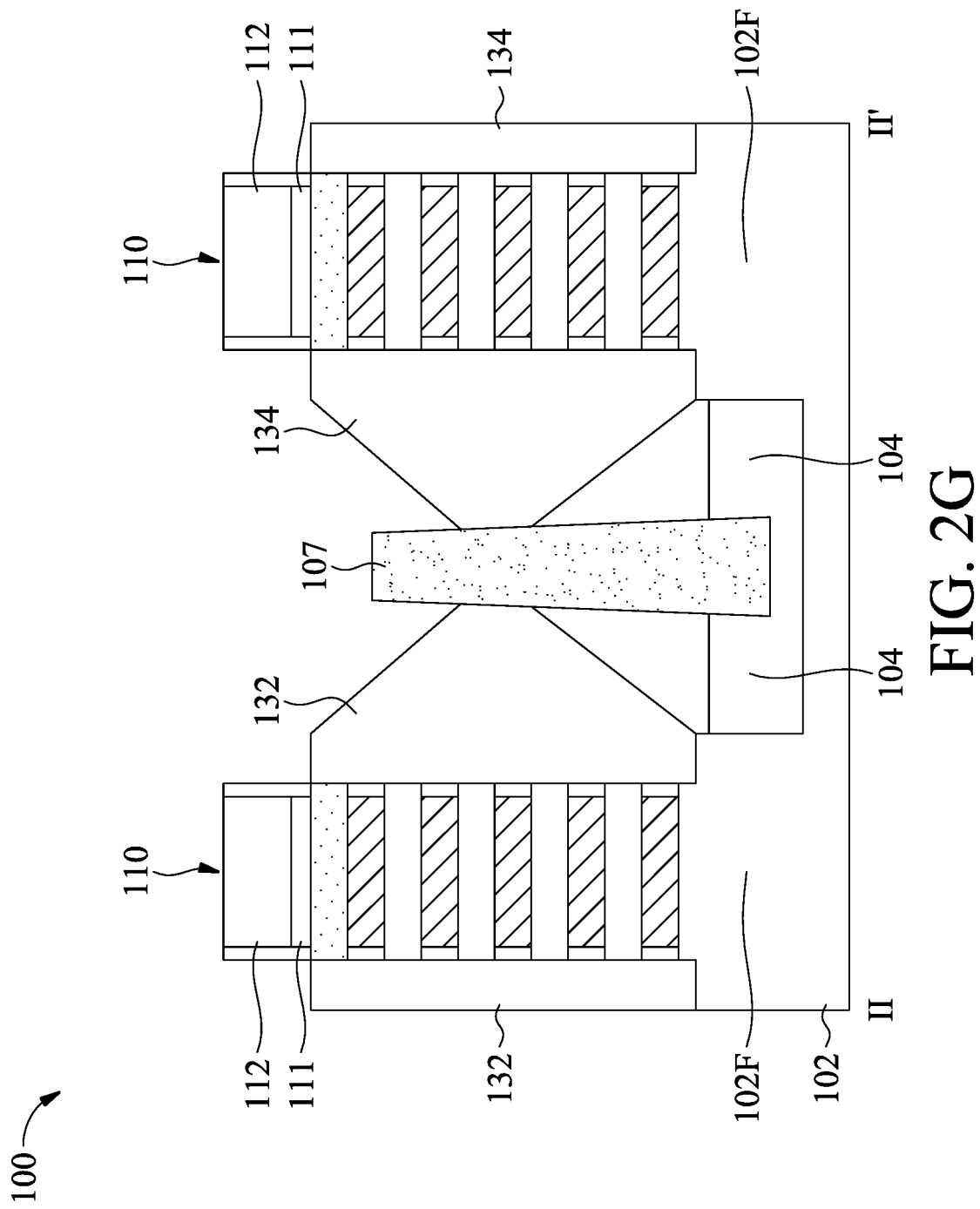

Next, referring to FIG. 2G, source and drain structures 132 are formed in the recesses 130 in the PMOS region 100A, in accordance with some embodiments. The source and drain structures 132 are on opposite sides of the dummy gate structure 110, the first hard mask 124, the gate spacers 114 and the semiconductor layers 121 and 122. Also, source and drain structures 134 are formed in the recesses 130 in the NMOS region 100B. The source and drain structures 134 are on opposite sides of the dummy gate structure 110, the second hard mask 126, the gate spacers 114 and the semiconductor layers 121 and 122. The source and drain structures 132 in the PMOS region 100A and the source and drain structures 134 in the NMOS region 100B may be made of different epitaxial semiconductor materials. The epitaxial semiconductor materials include silicon germanium ($SiGe1-x$, where x can be between approximately 0 and 1), silicon carbide (SiC), silicon phosphorus, germanium, an III-V compound semiconductor, an II-VI compound semiconductor, or another epitaxial semiconductor. The materials of an III-V compound semiconductor may include InAs, AlAs, GaAs, InP, GaN, InGaAs, InAlAs, GaSb, AlSb, AlP or GaP. In some examples, the source and drain structures 132 in the PMOS region 100A are made of SiGe, and the source and drain structures 134 in the NMOS region 100B are made of SiC.

The source and drain structures 132 and the source and drain structures 134 may be independently formed by metal-organic CVD (MOCVD), molecular beam epitaxy (MBE), liquid phase epitaxy (LPE), vapor phase epitaxy (VPE), selective epitaxial growth (SEG), or a combination thereof. The epitaxial source and drain structures 132 and 134 have several facets. In addition, the source and drain structures 132 and the source and drain structures 134 may be independently doped by in-situ doping during the epitaxial growth and/or by implantation after the epitaxial growth. In some instances, the top surfaces of the epitaxial source and drain structures 132 and 134 may be higher than or at the same level with the top surfaces of the first and second hard masks 124 and 126.

Moreover, some of the source and drain structures 132 in the PMOS region 100A may be shared between two neighboring transistors, such as through coalescing the structures by epitaxial growth. Also, some of the source and drain structures 134 in the NMOS region 100B may be shared between two neighboring transistors, such as through coalescing the structures by epitaxial growth. For example, the neighboring FinFETs with the shared source and drain structures may be implemented as two functional transistors. Other configurations in other examples may implement other numbers of functional transistors.

Figure 2H:
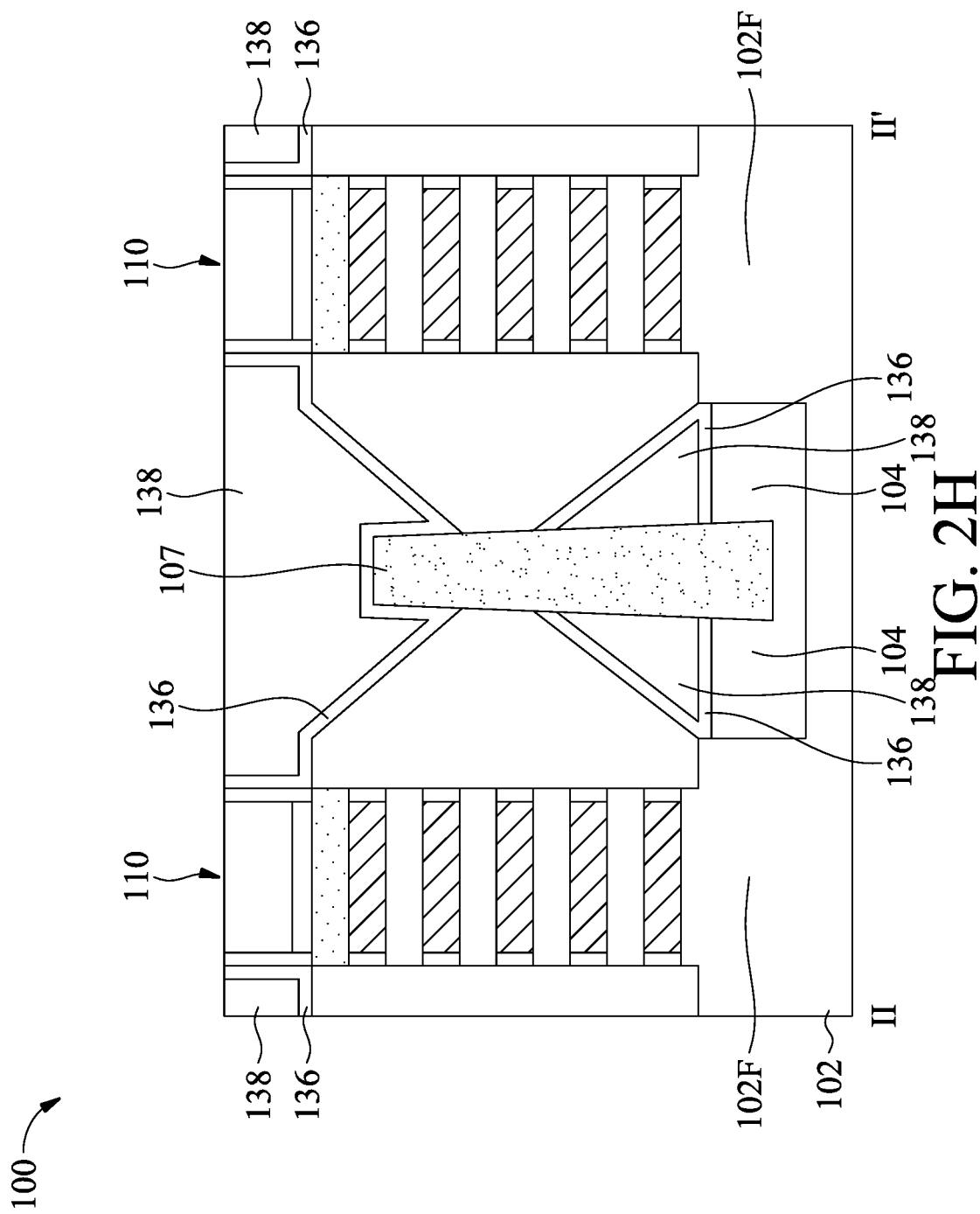

Next, referring to FIG. 2H, a contact etch stop layer (CESL) 136 and an interlayer dielectric (ILD) layer 138 are formed on the source and drain structures 132, the isolation structure 107 and the source and drain structures 134, in accordance with some embodiments. Moreover, the CESL 136 and the ILD layer 138 are also formed on the isolation structure 104. The CESL 136 is conformally deposited on the dummy gate structures 110, the gate spacers 114, the source and drain structures 132, the source and drain structures 134, the isolation structure 107 and the isolation structure 104. The ILD layer 138 is deposited on the CESL 136.

Generally, the CESL 136 can provide a mechanism to stop an etching process when forming via contacts to the source and drain structures 132 and 134. The CESL 136 may be formed of a dielectric material having a different etch selectivity from the adjacent ILD layer 138. The material of the CESL 136 may include silicon nitride (SiN or $Si_3N_4$), silicon carbon nitride (SiCN) or a combination thereof, and may be deposited by CVD, PECVD, ALD, or another deposition process. In some examples, the CESL 136 has a thickness in a range from about 2 nm to about 5 nm. The material of the ILD layer 138 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 138 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 138 and the CESL 136. The hard mask on the dummy gate structures 110 and some portions of the gate spacers 114 are also removed in the planarization process. After the planarization process, the dummy gate electrode layers 112 are exposed. The top surfaces of the ILD layer 138 and the CESL 136 may be coplanar with the top surfaces of the dummy gate electrode layers 112 and the gate spacers 114.

Figure 2I:
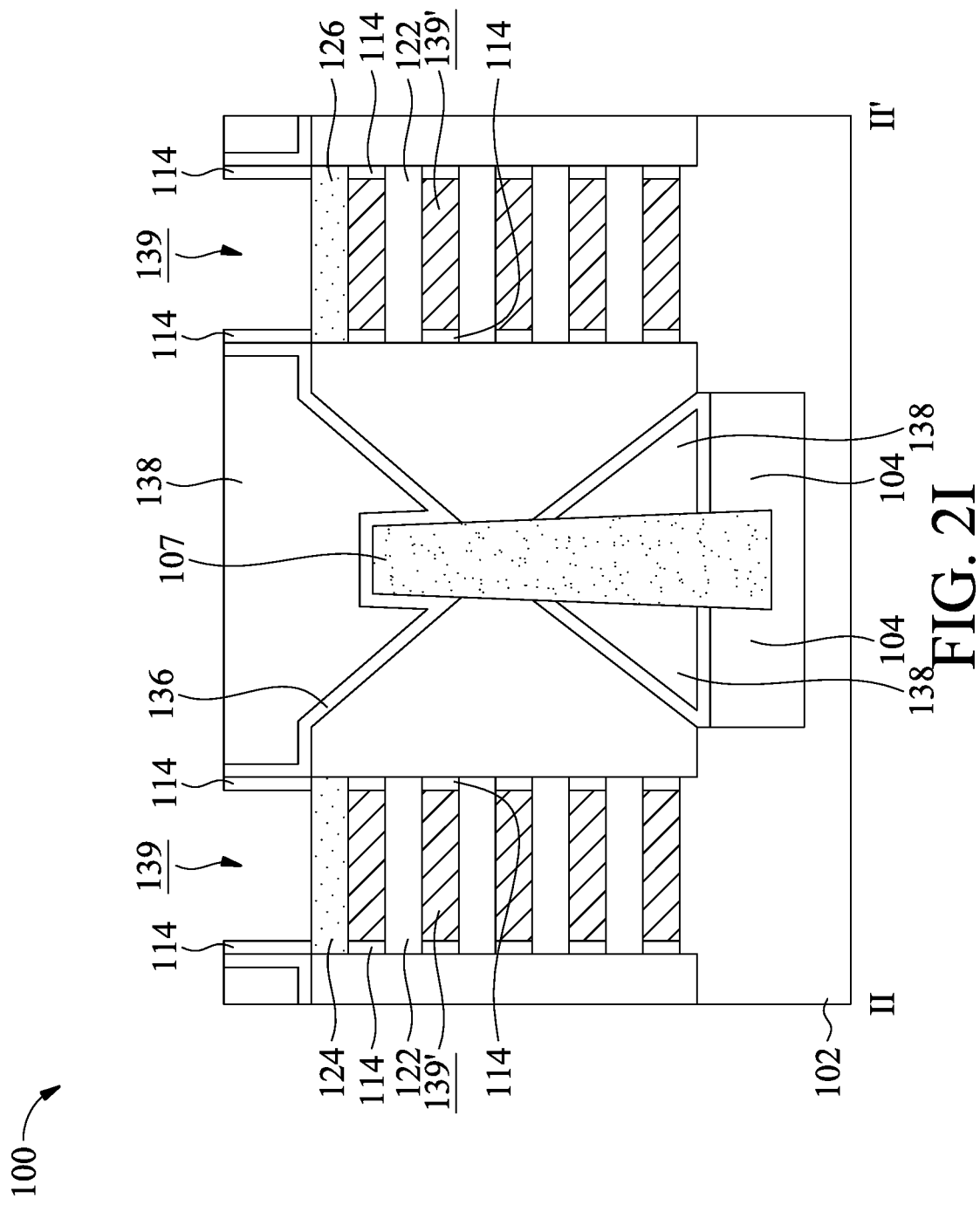

Next, referring to FIG. 2I, the dummy gate electrode layers 112, the dummy gate dielectric layers 111 and the semiconductor layers 121 (FIG. 2H) are removed using one or more etching processes, in accordance with some embodiments. Thereafter, in the PMOS region 100A, a trench 139 is formed between the gate spacers 114 above the first hard mask 124 and multiple spaces 139' are formed between the gate spacers 114 under the first hard mask 124. Each of the space 139' is between the semiconductor layers 122. Also, in the NMOS region 100B, a trench 139 is formed between the gate spacers 114 above the second hard mask 126 and multiple spaces 139' are formed between the gate spacers 114 under the second hard mask 126. Each of the space 139' is between the semiconductor layers 122. In some examples, each of the spaces 139' between the neighboring semiconductor layers 122 has a height that is in a range from about 8 nm to about 12 nm. The semiconductor layers 122 are spaced apart from each other by a distance that is in a range from about 8 nm to about 12 nm. Each of the semiconductor layers 122 has a thickness that is in a range from about 4 nm to about 6 nm. The semiconductor layers 122 may be referred to as nanosheets or nanowires. The spaces 139' may be referred to as sheet-sheet spacing. The gate spacers 114 under the first and second hard masks 124 and 126 may be referred to as inner spacers. The semiconductor layers 122 serve as channel layers of the semiconductor device 100.

Figures 1, 2J:
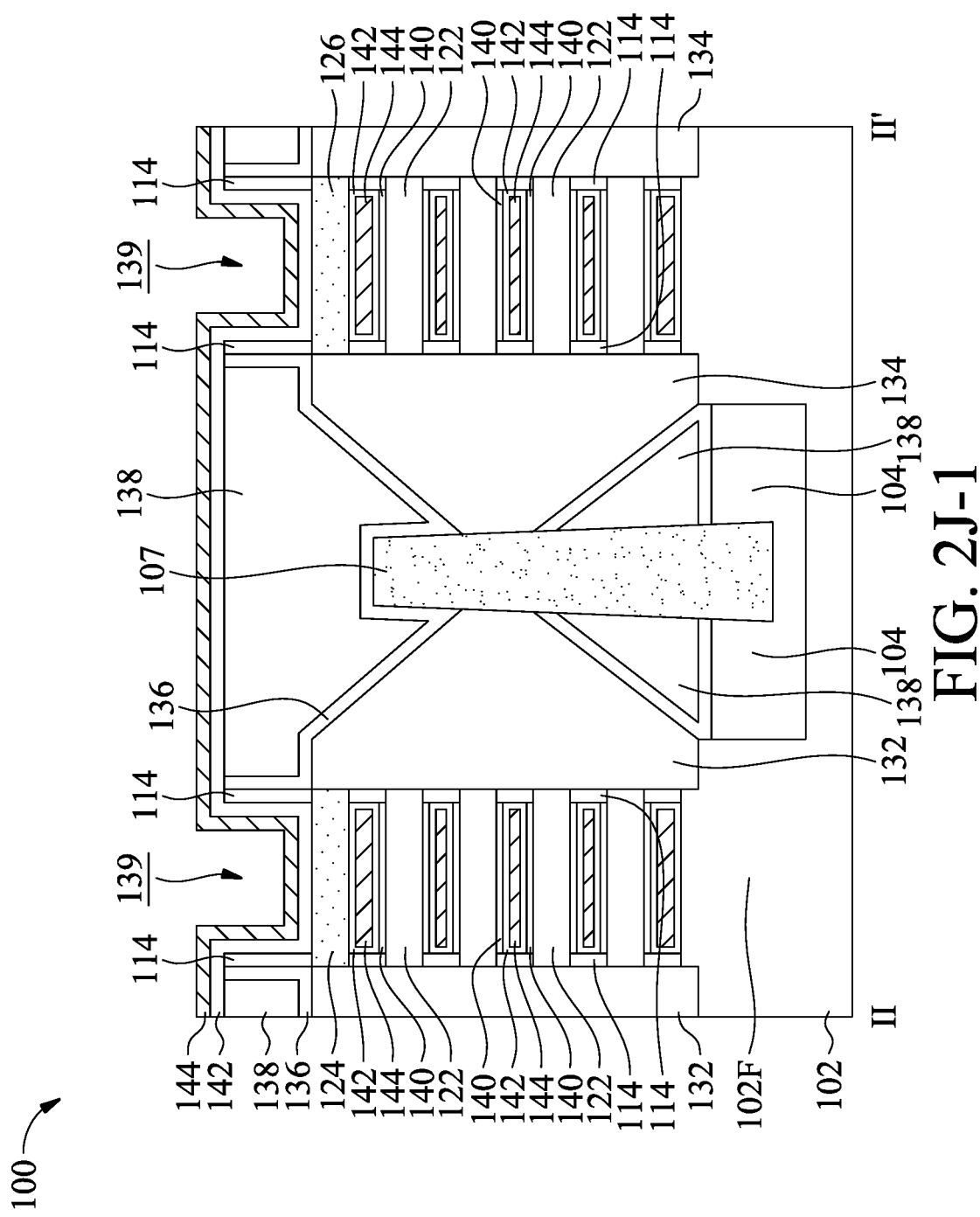

Next, referring to FIG. 2J-1, an interfacial layer (IL) 140 is formed on and around the semiconductor layers 122 and in the spaces 139', in accordance with some embodiments. The interfacial layer 140 may be silicon oxide and formed by deposition, chemical oxidation or thermal oxidation process. In some instances, the interfacial layer 140 may also be deposited on the first and second hard masks 124 and 126 and in the trenches 139. The interfacial layer 140 has a thickness that may be in a range from about 5 Å to about 15 Å.

Afterwards, a gate dielectric layer 142 is conformally deposited on the ILD layer 138, the CESL 136 and the gate spacers 114 and in the trenches 139, and on the interfacial layer (IL) 140 and the gate spacers 114 in the spaces 139'. The gate dielectric layer 142 also surrounds the semiconductor layers 122. The gate dielectric layer 140 includes silicon oxide, silicon nitride, a high-k dielectric material, multilayers thereof, or other dielectric material. The high-k dielectric material may have a k-value greater than about 7.0. The high-k dielectric material may include a metal oxide of or a metal silicate of Hf, Al, Zr, La, Mg, Ba, Ti, Pb, or a combination thereof. In some examples, the gate dielectric layer 142 may be a high-k gate dielectric layer that includes AlOx, HfO2, ZrO2, HfAlOx, HfSiOx or a combination thereof. The gate dielectric layer 142 may be deposited by ALD, PECVD, molecular-beam deposition (MBD), or another deposition process. In some examples, the gate dielectric layer 142 has a thickness that is in a range from about 10 Å to about 20 Å.

Next, a p-type work function (PWF) layer 144 is conformally deposited on the gate dielectric layer 142 and in the trenches 139 and the spaces 139' in both the PMOS region 100A and the NMOS region 100B, in accordance with some embodiments. The PWF layer 144 also surrounds the semiconductor layers 122 and may full fill the spaces 139' in the PMOS region 100A and the NMOS region 100B. Some portions of the PWF layer 144 are merged in-between the nanosheets. The PWF layer 144 includes TiN, TaN, TaSiN, TaSi$_2$, Ru, Mo, MoSi$_2$, ZrSi$_2$, NiSi$_2$, WN or WCN and serves the Vt tuning of PMOS. In some examples, the PWF layer 144 has a thickness that is in a range from about 10 Å to about 30 Å.

Afterwards, FIGS. 2J-2, 2K-1, 2L-1, 2M-1, 2N-1, 2O-1, 2P-1, 2Q-1 and 2R-1 show cross-sectional views of respective structures at various stages of an exemplary method for fabricating the semiconductor device 100 taken along line A-A' in FIG. 1, in accordance with some embodiments. Line A-A' is on a plane that is along the center line of the dummy gate structure 110 in the PMOS region 100A and the NMOS region 100B and across the fin structure 106, the isolation structure 107 and the fin structure 108. Meanwhile, FIGS. 2K-2, 2L-2, 2M-2, 2N-2, 2O-2, 2P-2 and 2Q-2 show cross-sectional views of respective structures at various stages of an exemplary method for fabricating the semiconductor device 100 taken along line B-B' in FIG. 1, in accordance with some embodiments. Line B-B' is on a plane that is along the sidewall of the dummy gate structure 110 in the PMOS region 100A and the NMOS region 100B and across the fin structure 106, the isolation structure 107 and the fin structure 108. As described on the above mentioned description, the dummy gate structure 110 is replaced with a GAA structure.

Figures 2, 2J:
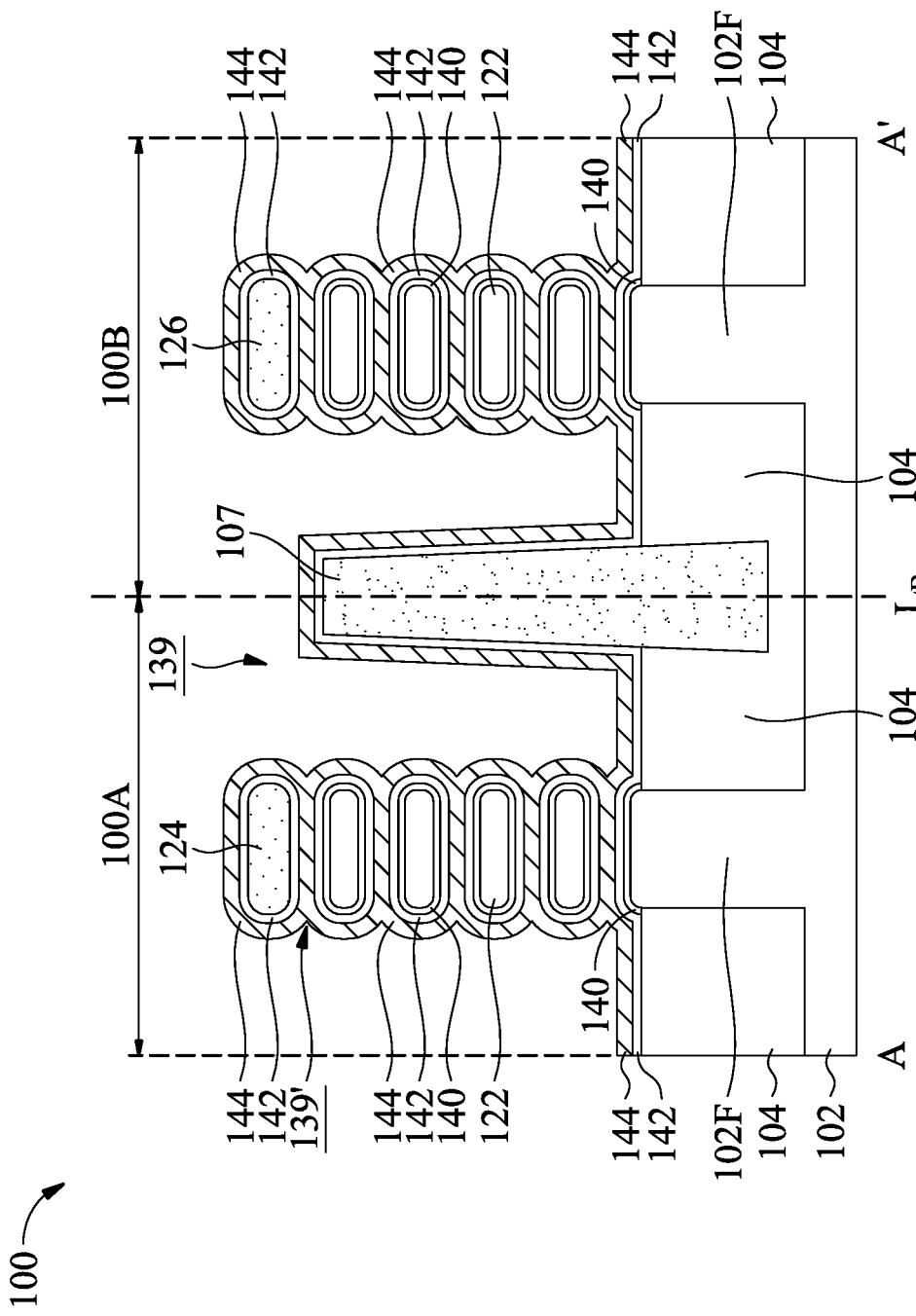

Referring to FIG. 2J-2, the semiconductor layers 122 in the PMOS region 100A and the NMOS region 100B are surrounded by the interfacial layer (IL) 140, the gate dielectric layer 142 and the PWF layer 144 in sequence, in accordance with some embodiments. Moreover, the first and second hard masks 124 and 126 are surrounded by the gate dielectric layer 142 and the PWF layer 144 in sequence. The spaces 139' are full filled with the interfacial layer (IL) 140, the gate dielectric layer 142 and the PWF layer 144. The trenches 139 are not full filled with the gate dielectric layer 142 and the PWF layer 144. In addition, the interfacial layer (IL) 140 is also formed on the exposed surfaces of the fin bases 102F. The gate dielectric layer 142 and the PWF layer 144 are also conformally deposited on the isolation structure 104, the fin bases 102F and the isolation structure 107.

Figures 1, 2K:
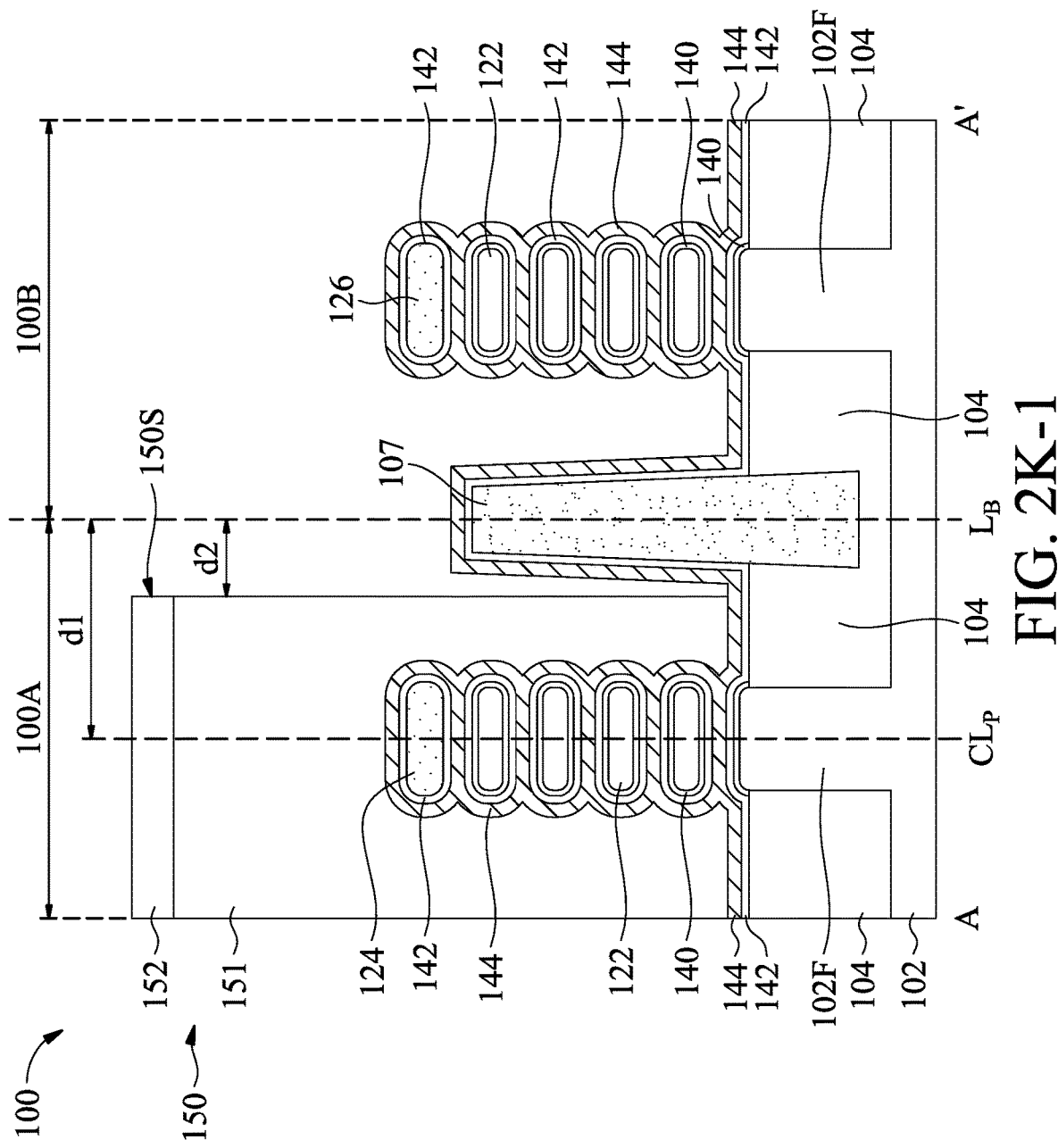
Figures 2, 2K:
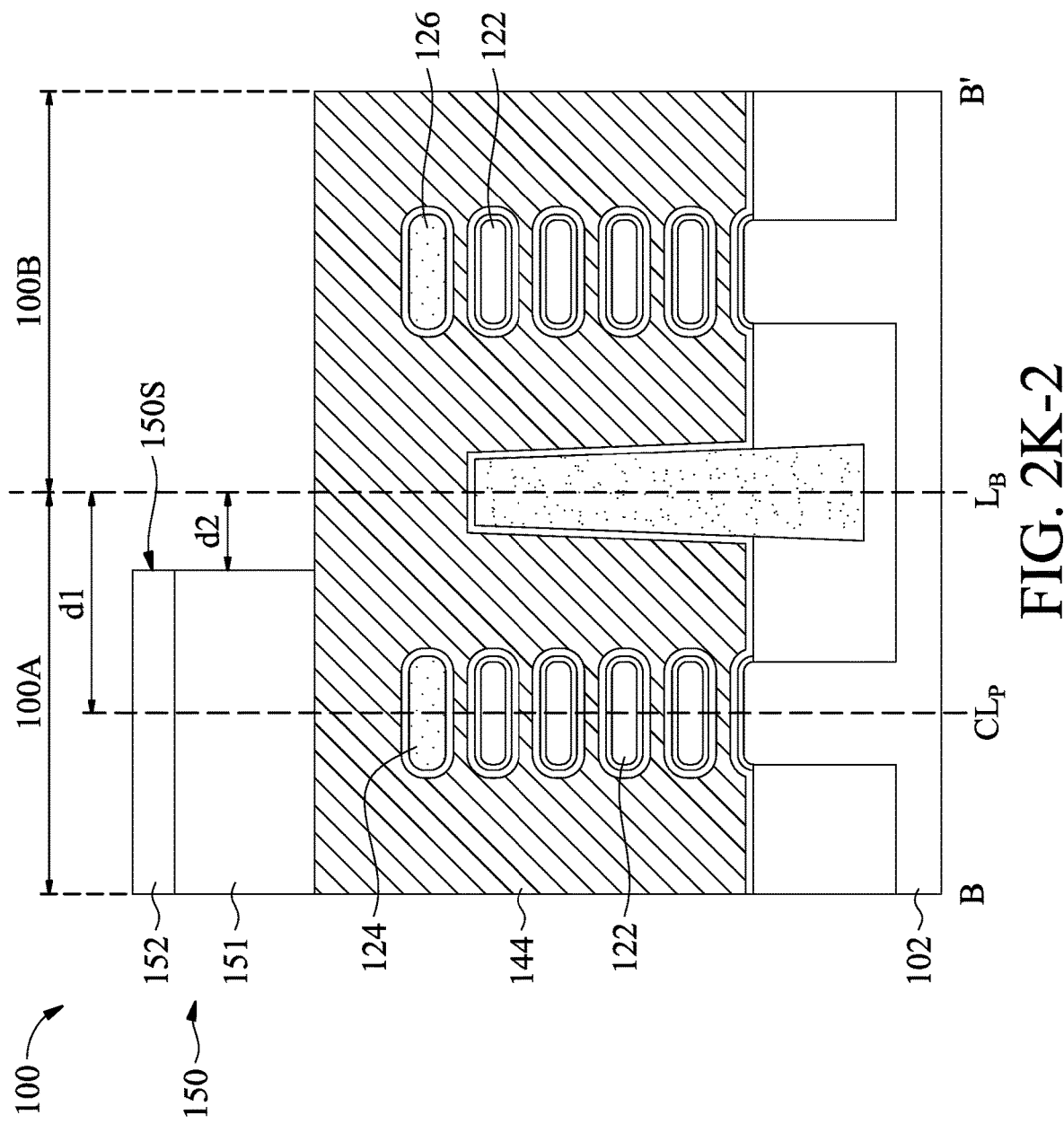

Next, referring to FIGS. 2K-1 and 2K-2, a first patterned mask 150 is formed on the PWF layer 144 in the PMOS region 100A, in accordance with some embodiments. The first patterned mask 150 is back from the boundary $L_B$ between the PMOS region 100A and the NMOS region 100B by a distance d2. The first patterned mask 150 is formed on the PWF layer 144 in the PMOS region 100A to cover the semiconductor layers 122 and the first hard mask 124 at the center line of a GAA structure, as shown in FIG. 2K-1 in accordance with some embodiments. The first patterned mask 150 is formed on the PWF layer 144 along the sidewall of the GAA structure, as shown in FIG. 2K-2 in accordance with some embodiments. The first patterned mask 150 has a sidewall 150S that is close to the boundary $L_B$. The distance d2 is between the sidewall 150S and the boundary $L_B$.

The semiconductor layers 122 and the first hard mask 124 in the PMOS region 100A have a center line $CL_P$. The semiconductor layers 122 in the PMOS region 100A may be referred to as first semiconductor nanosheets. There is a distance d1 between the center line $CL_P$ of the first semiconductor nanosheets and the boundary $L_B$. According to some embodiments of the disclosure, the distance d2 is greater than 0 nm and shorter than or equal to half of the distance d1, i.e. 0 nm<d2≤(0.5×d1).

The first patterned mask 150 includes a bottom anti-reflective coating (BARC) 151 and a photoresist 152 on the BARC 151. The BARC 151 of the first patterned mask 150 is in direct contact with the PWF layer 144 in the PMOS region 100A. The material of the BARC 151 has excellent adhesion to the PWF layer 144. The first patterned mask 150 is formed by coating a BARC material layer on the PWF layer 144 and covering the semiconductor layers 122 and the first hard mask 124 in the PMOS region 100A and then coating a photoresist layer on the BARC material layer. Afterwards, the photoresist layer and the BARC material layer are patterned together using a photolithography process to form the first patterned mask 150. The sidewall 150S of the first patterned mask 150 is defined by the photolithography process.

Figures 2, 2K, 3:
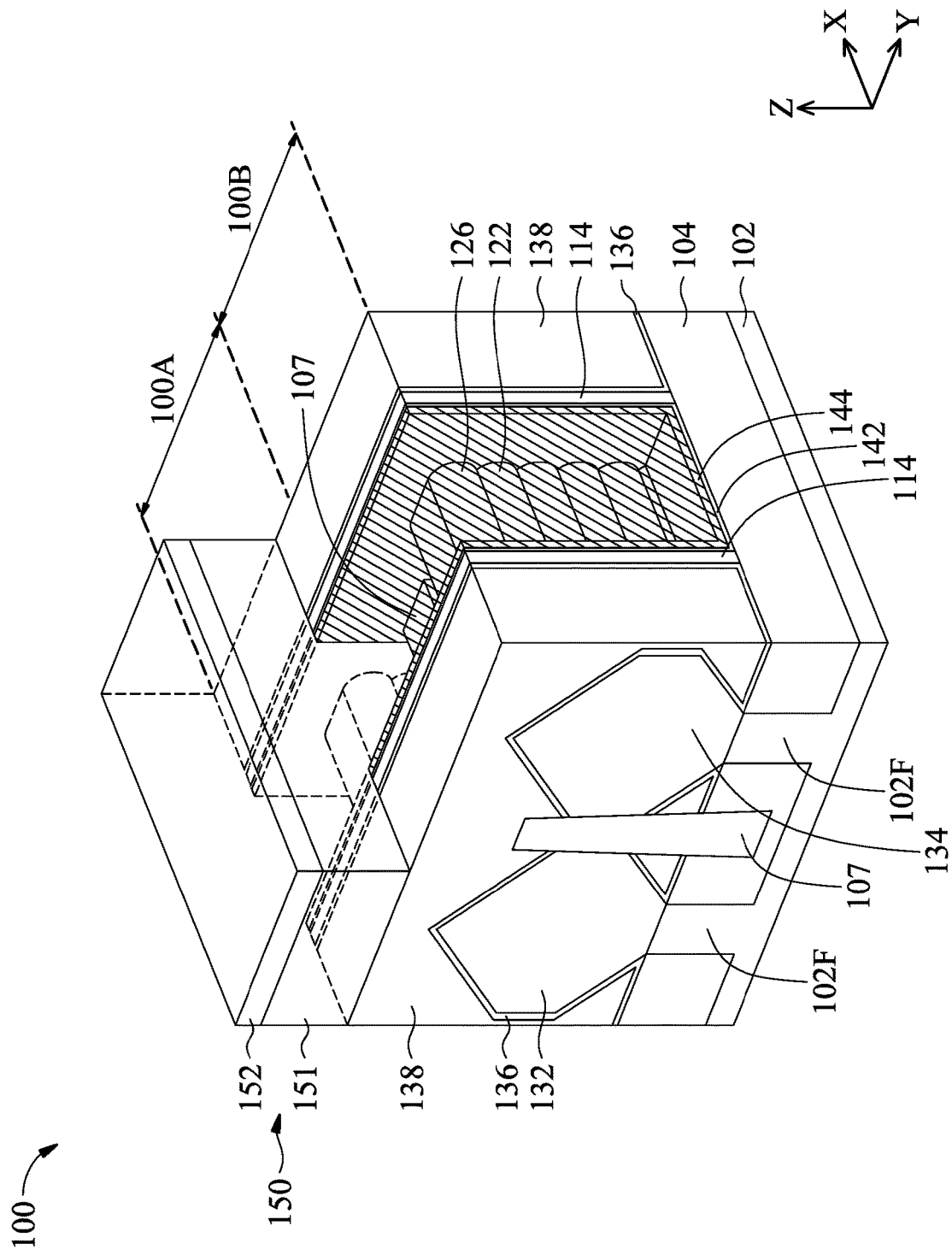
Figures 2, 2K, 3, 4:
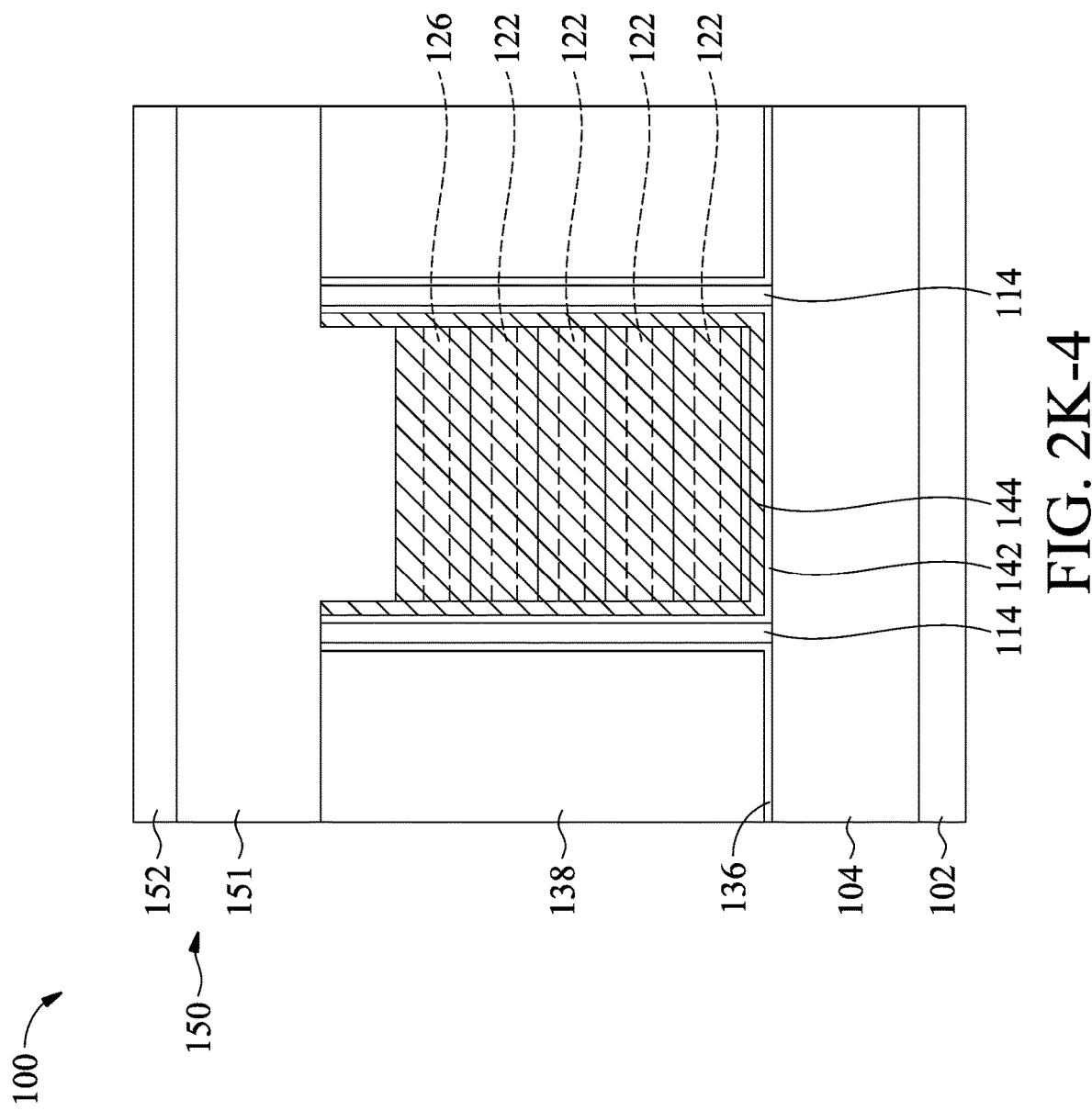

Meanwhile, FIG. 2K-3 shows a perspective view of the structure of FIGS. 2K-1 and 2K-2, in accordance with some embodiments. In addition, FIG. 2K-4 shows a front view of the structure of FIG. 2K-3, in accordance with some embodiments. The first patterned mask 150 is disposed on the PWF layer 144 in the PMOS region 100A and inside the boundary $L_B$. In some embodiments, the sidewall 150S of the first patterned mask 150 is between the isolation structure 107 and the semiconductor layers 122 in the PMOS region 100A (also referred to as first semiconductor nanosheets). The semiconductor layers 122 in the PMOS region 100A are completely covered with the first patterned mask 150. The isolation structure 107 and the semiconductor layers 122 in the NMOS region 100B (also referred to as second semiconductor nanosheets) are exposed through the first patterned mask 150. In some embodiments, the isolation structure 107 is not overlapped with the first patterned mask 150. In some other embodiments, the first patterned mask 150 partially overlaps with the isolation structure 107 and is not over the boundary $L_B$.

Figures 1, 2L:
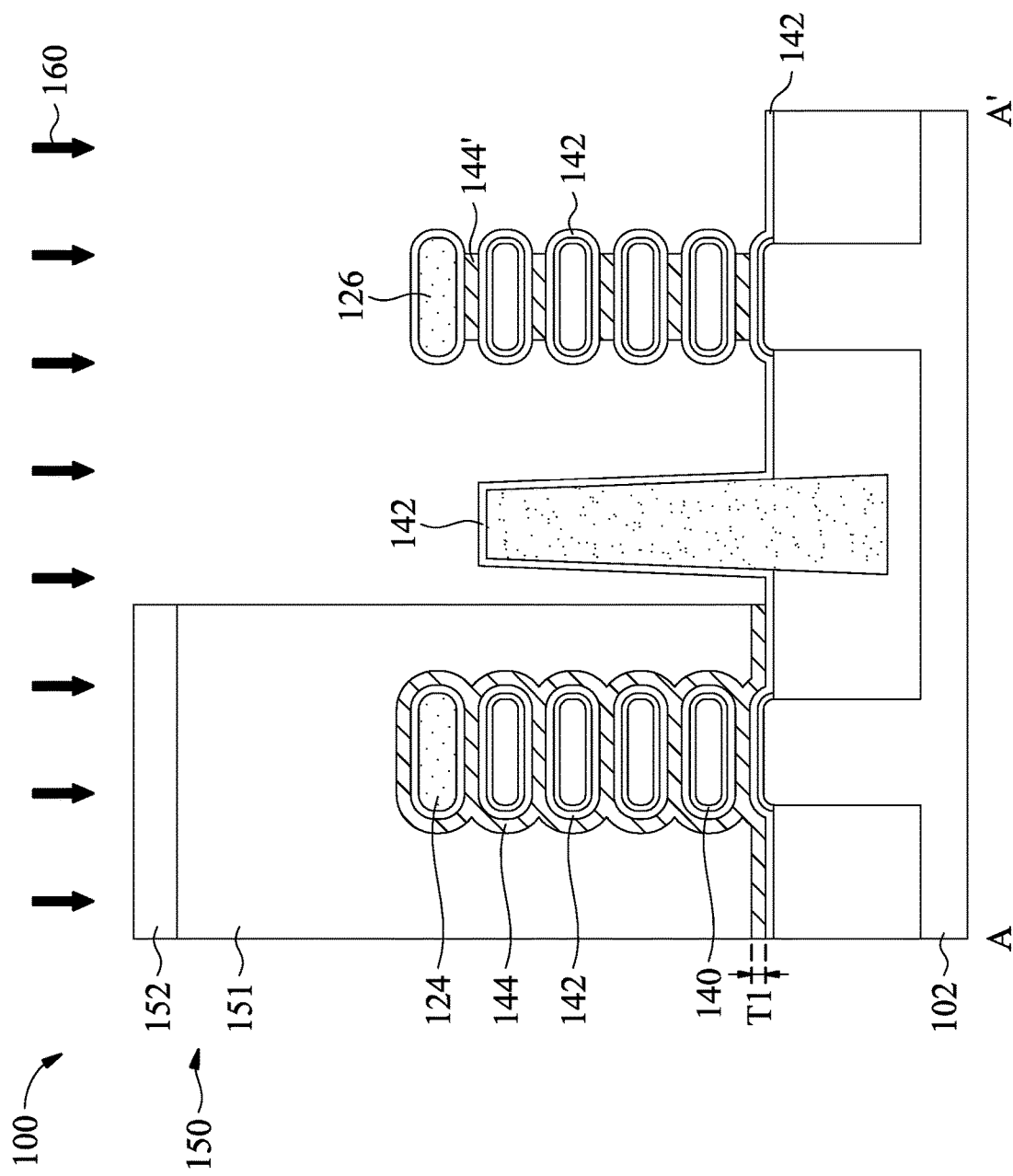
Figures 2, 2L:
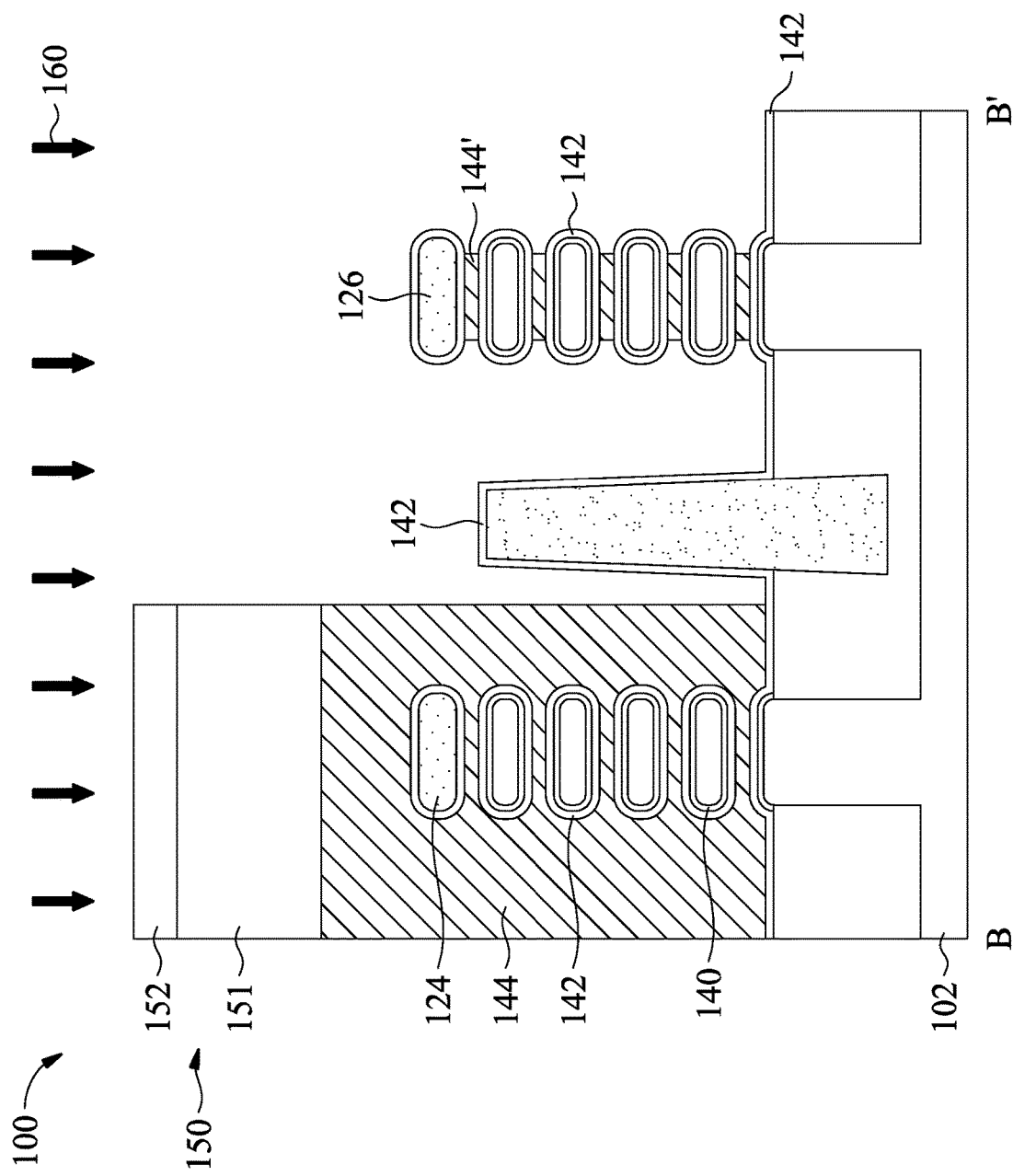
Figures 2, 2L, 3:
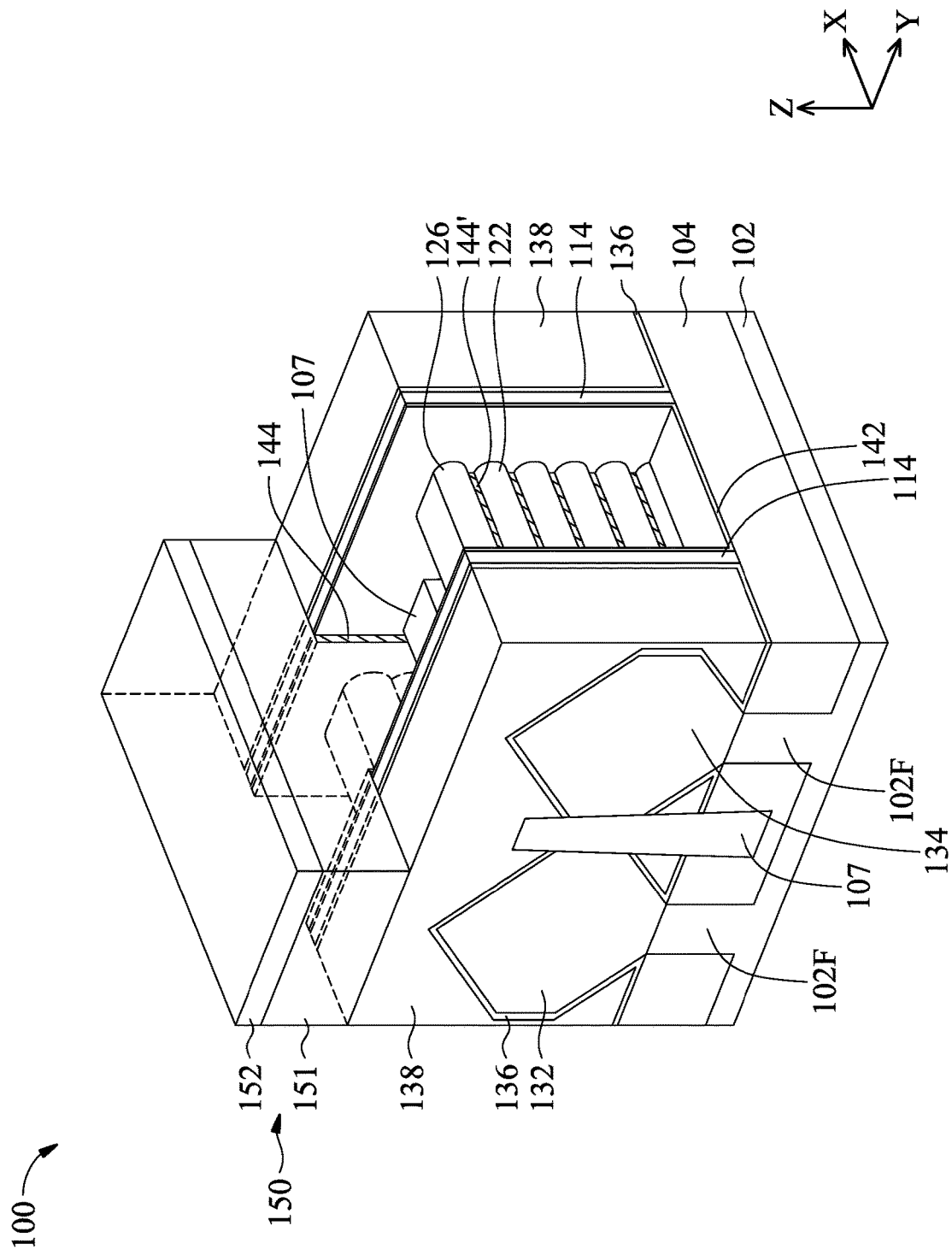
Figures 2, 2L, 3, 4:
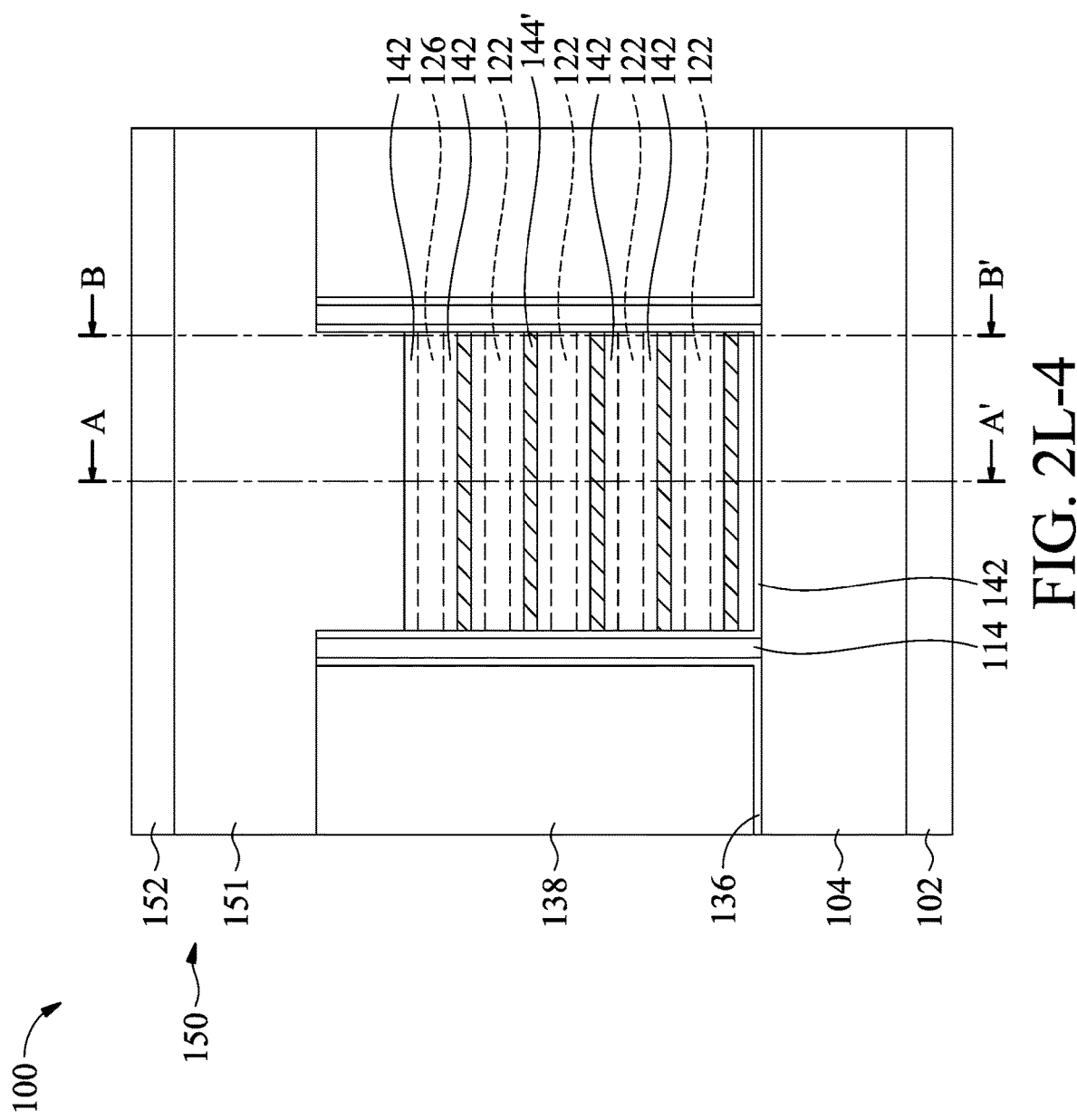

Next, referring to FIGS. 2L-1 and 2L-2, a first wet etching process 160 is performed on the area not covered with the first patterned mask 150 to remove a portion of the PWF layer 144, in accordance with some embodiments. The etching amount of the first wet etching process 160 is equal to the thickness T1 of the PWF layer 144. In some examples, the thickness T1 is in a range from about 10 Å to about 30 Å. The etching amount of the first wet etching process 160 can be adjusted by etching time and temperature. The first wet etching process 160 is performed with etchant solution, for example an acid solution of HCl, $NH_4OH$ or $H_2SO_4$ mixed with an oxidant of $H_2O_2$. The PWF layer 144 is slightly removed in the first wet etching process 160. Thereafter, the PWF layer 144 on the isolation structure 107 and on the outside surfaces of the second hard mask 126 and the semiconductor layers 122 in the NMOS region 100B are removed. As a result, some portions 144' of the PWF layer 144 between the semiconductor layers 122 and between the second hard mask 126 and the top semiconductor layer 122 in the NMOS region 100B are remained.

The first patterned mask 150 has excellent adhesion to the PWF layer 144 and has great blocking ability in the first wet etching process 160. Therefore, the portion of the PWF layer 144 under the first patterned mask 150 is not damaged and the boundary anchor of the PWF layer 144 is reinforced to cut off the lateral loss path along the boundary $L_B$. Moreover, the semiconductor layers 122 in the PMOS region 100A are protected by the first patterned mask 150 in the first wet etching process 160 without damages. The etched PWF layer 144 in the PMOS region 100A has a sidewall that is aligned with the sidewall 150S of the first patterned mask 150, as shown in FIGS. 2L-1 and 2L-2 in accordance with some embodiments.

Meanwhile, FIG. 2L-3 shows a perspective view of the structure of FIGS. 2L-1 and 2L-2, and FIG. 2L-4 shows a front view of the structure of FIG. 2L-3, in accordance with some embodiments. The PWF layer 144, the first hard mask 124 and the semiconductor layers 122 in the PMOS region 100A are covered with the first patterned mask 150. After the first wet etching process 160 is performed, the gate dielectric layer 142 on the isolation structure 107, on the outside surfaces of the second hard mask 126 and the semiconductor layers 122 in the NMOS region 100B is exposed. Moreover, the portions 144' of the PWF layer 144 remained between the semiconductor layers 122 and between the second hard mask 126 and the top semiconductor layer 122 in the NMOS region 100B are exposed.

Figures 1, 2M:
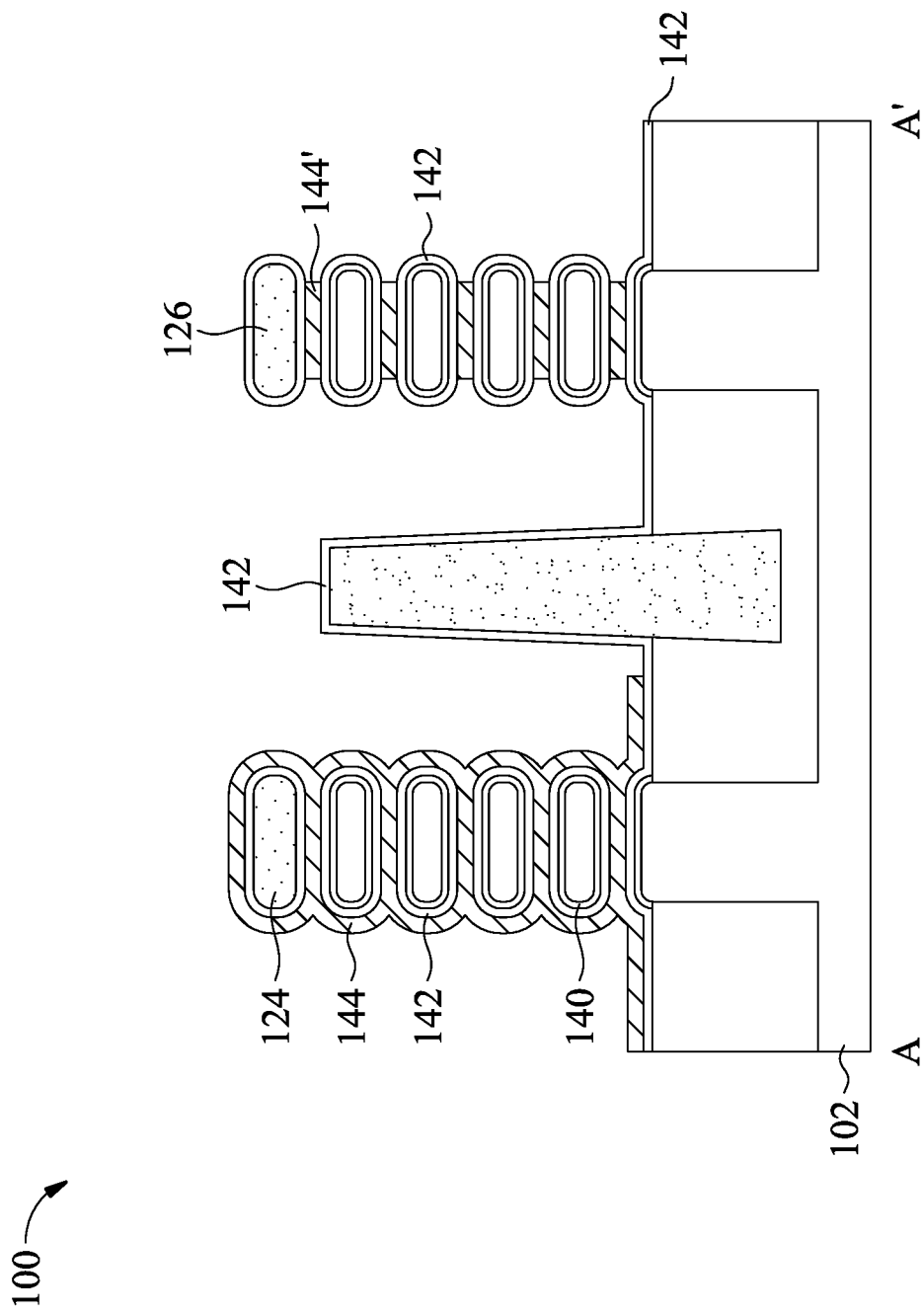
Figures 2, 2M:
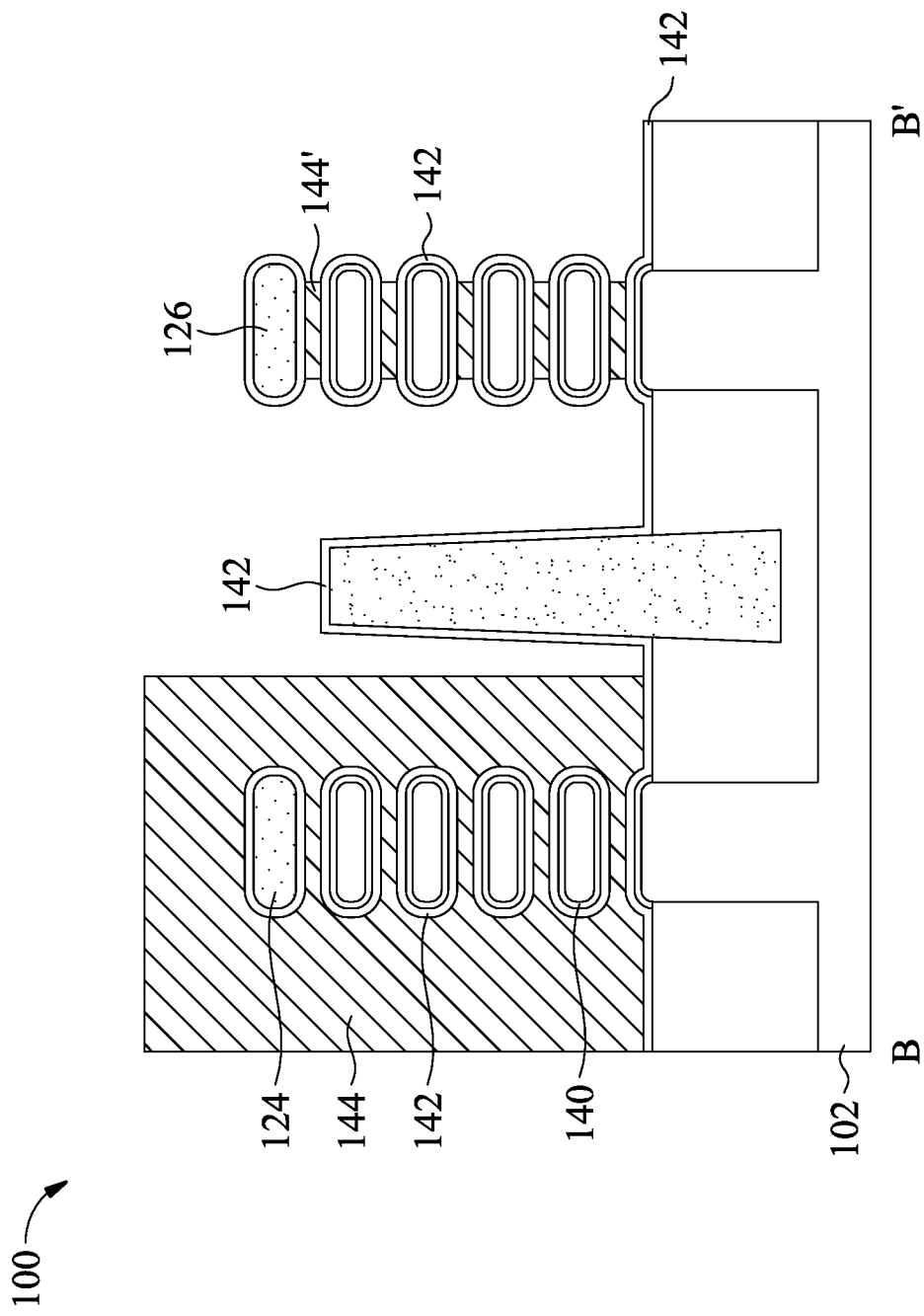
Figures 2, 2M, 3:
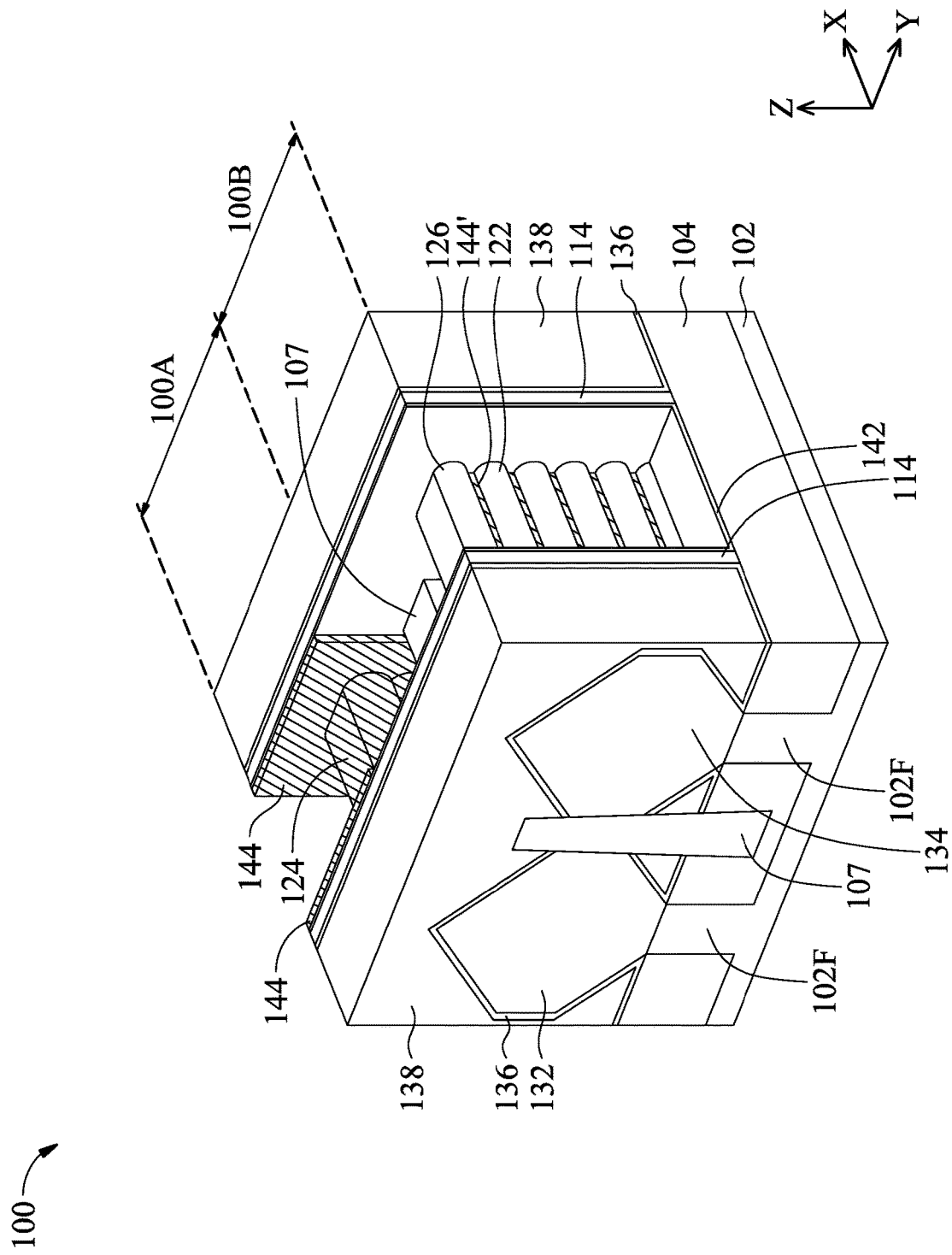

Next, referring to FIGS. 2M-1 and 2M-2, the first patterned mask 150 is removed, in accordance with some embodiments. In some examples, the first patterned mask 150 is removed by an ashing process using $N_2$ and $H_2$. Thereafter, the PWF layer 144 in the PMOS region 100A is exposed. The PWF layer 144 in the PMOS region 100A has an edge that is back from the boundary $L_B$ by the distance d2 (FIGS. 2K-1 and 2K-2). Meanwhile, FIG. 2M-3 shows a perspective view of the structure of FIGS. 2M-1 and 2M-2, and FIG. 2M-4 shows a front view of the structure of FIG. 2M-3, in accordance with some embodiments. The structures of FIGS. 2M-3 and 2M-4 are similar to FIGS. 2L-3 and 2L-4 except the removal of the first patterned mask 150.

Figures 1, 2N:
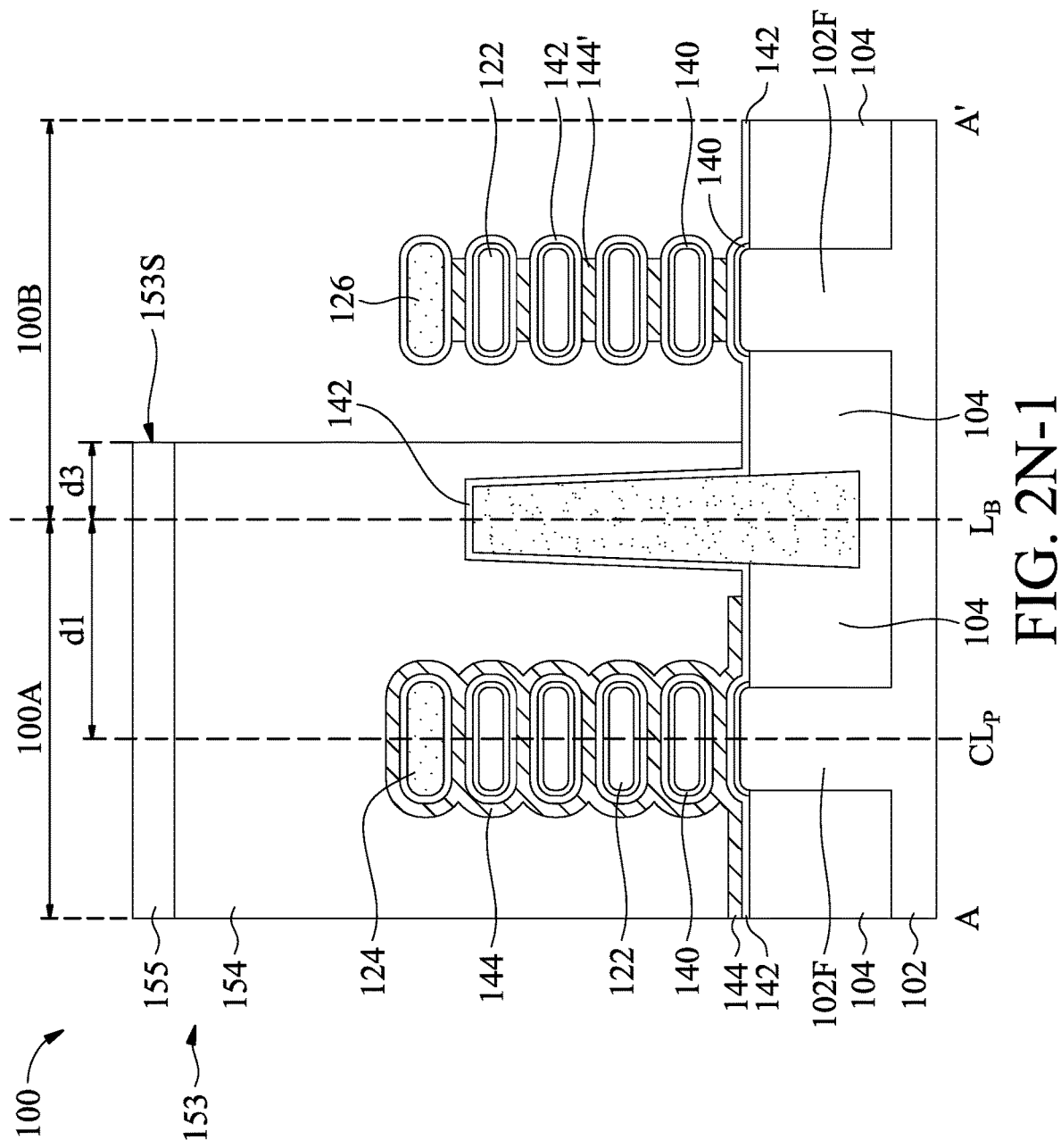
Figures 2, 2N:
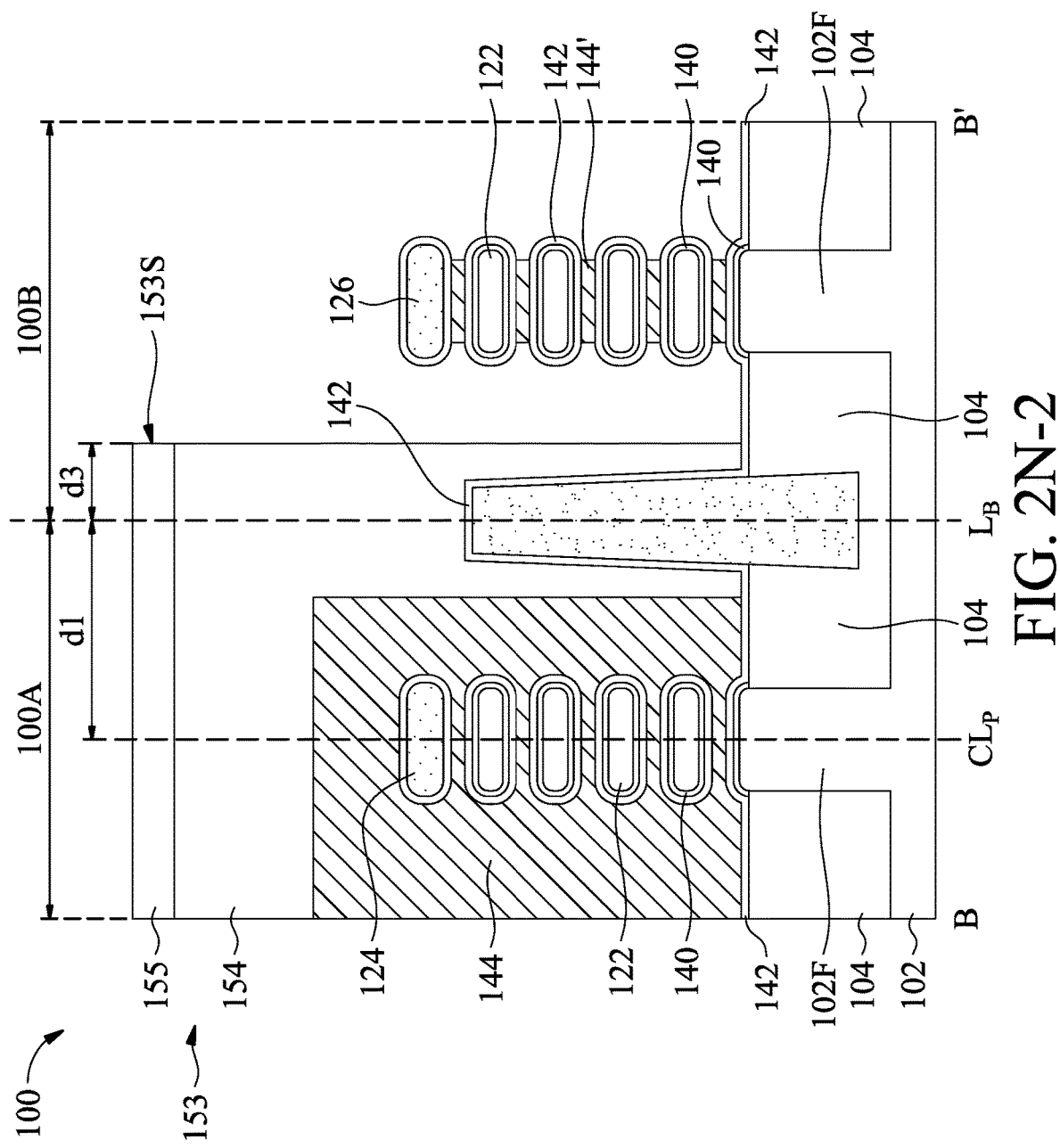
Figures 2, 2N, 3:
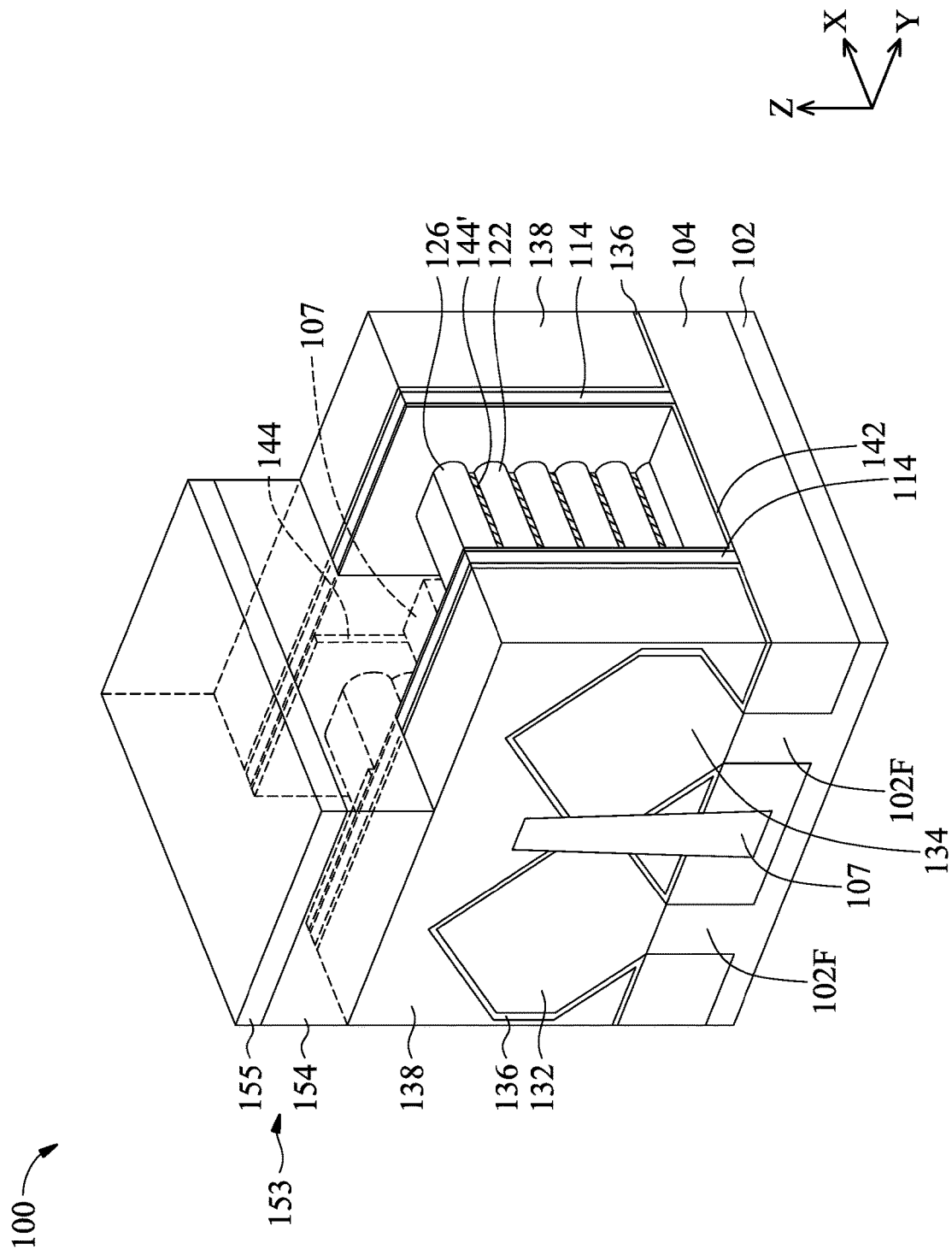
Figures 1, 20:
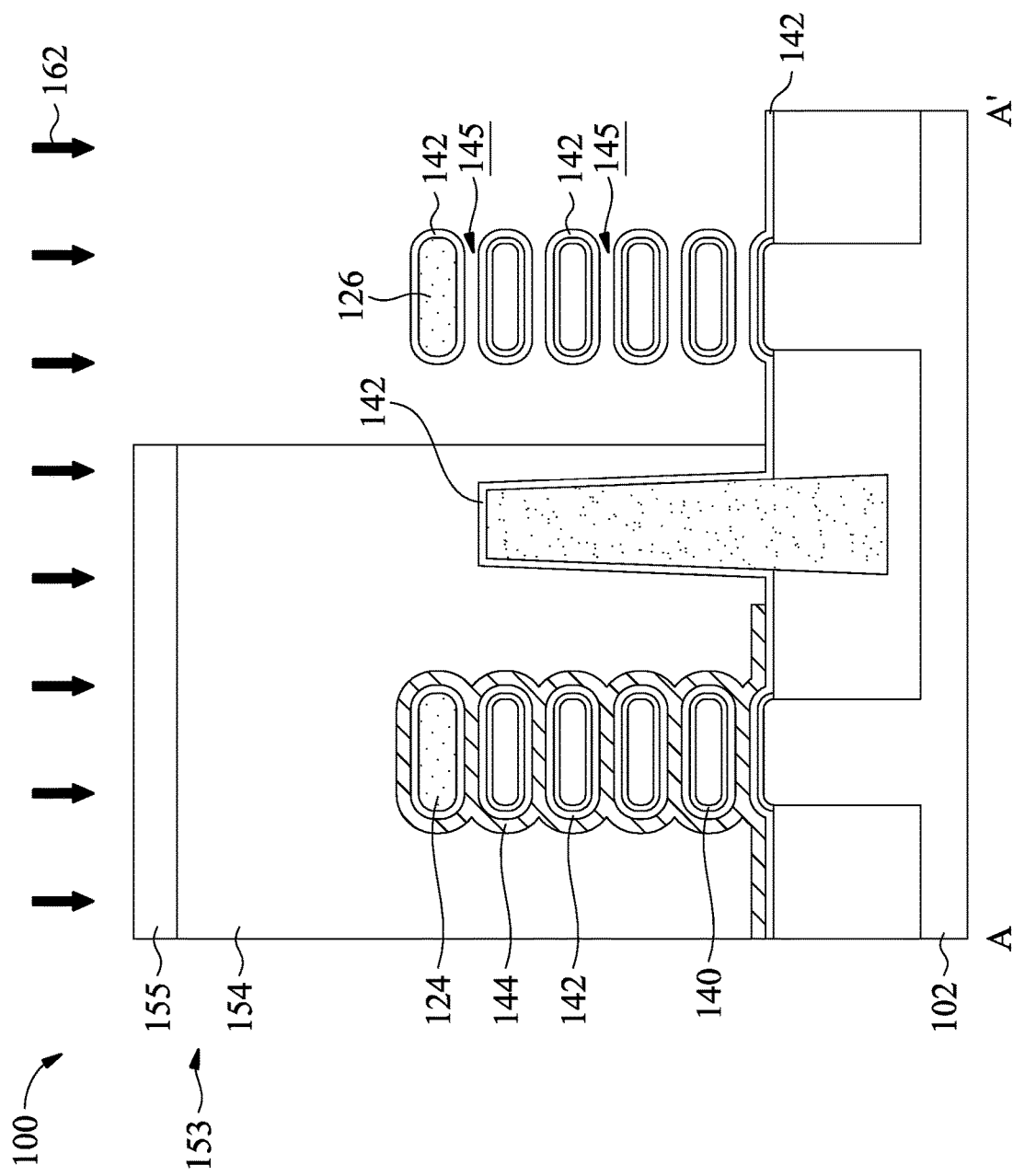
Figures 2, 20:
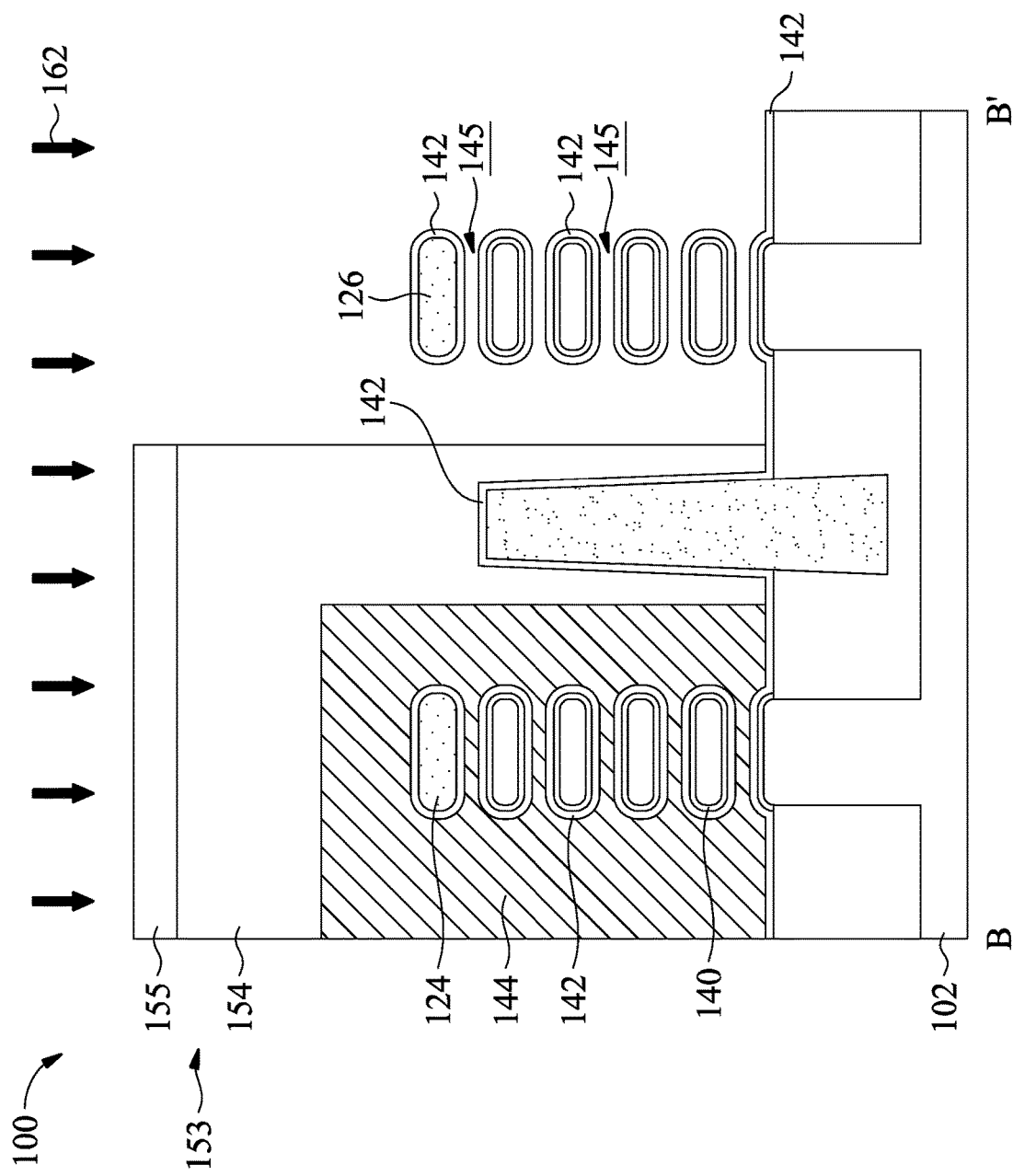

Next, referring to FIGS. 2N-1 and 2N-2, a second patterned mask 153 is formed on the PWF layer 144 in the PMOS region 100A and is also formed on the isolation structure 107, in accordance with some embodiments. The second patterned mask 153 has a sidewall 153S close to the boundary $L_B$. There is a distance d3 between the boundary $L_B$ and the sidewall 153S. The semiconductor layers 122 in the PMOS region 100A may be referred to as first semiconductor nanosheets. As described in FIGS. 2K-1 and 2K-2, the distance d1 is between the center line $CL_P$ of the first semiconductor nanosheets and the boundary $L_B$. According to some embodiments of the disclosure, the distance d3 is greater than or equal to 0 nm and shorter than half of the distance d1, i.e. 0 nm≤d3<(0.5×d1). In some embodiments, the sidewall 153S of the second patterned mask 153 is at the boundary $L_B$. In some embodiments, the sidewall 153S of the second patterned mask 153 is over the boundary $L_B$ and completely or partially covers the isolation structure 107.

The second patterned mask 153 includes a bottom anti-reflective coating (BARC) 154 and a photoresist 155 on the BARC 153. The BARC 154 is in direct contact with the PWF layer 144 in the PMOS region 100A and the gate dielectric layer 142 on the isolation structure 107. The material of the BARC 154 has excellent adhesion to the PWF layer 144 and the gate dielectric layer 142. Moreover, the second patterned mask 153 has great wet etching blocking ability. In some embodiments, the materials of the BARC 154 and the photoresist 155 of the second patterned mask 153 are the same as or similar to the BARC 151 and the photoresist 152 of the first patterned mask 150. In addition, the processes of forming the second patterned mask 153 are the same as or similar to those of the first patterned mask 150.

The second patterned mask 153 covers the PWF layer 144, the semiconductor layers 122, the first hard mask 124 and the isolation structure 107 in the PMOS region 100A, as shown in FIGS. 2N-1 and 2N-1 in accordance with some embodiments. Moreover, the second patterned mask 153 is in direct with the PWF layer 144 and the gate dielectric layer 142 on the isolation structure 107. The second patterned mask 153 completely covers the sidewall of the PWF layer 144 to protect the boundary of the PWF layer 144, as shown in FIGS. 2N-1 and 2N-2 in accordance with some embodiments. The portions 144' of the PWF layer 144 remained between the semiconductor layers 122 in the NMOS region 100B are exposed through the second patterned mask 153.

Meanwhile, FIG. 2N-3 shows a perspective view of the structure of FIGS. 2N-1 and 2N-2 in accordance with some embodiments. The second patterned mask 153 is disposed on the PWF layer 144 in the PMOS region 100A and may be outside or at the boundary $L_B$ between the PMOS region 100A and the NMOS region 100B. In some embodiments, the sidewall 153S of the second patterned mask 153 is between the isolation structure 107 and the semiconductor layers 122 in the NMOS region 100B (also referred to as second semiconductor nanosheets). The isolation structure 107 may be completely covered with the second patterned mask 153. In some other embodiments, the second patterned mask 153 is over the boundary LB and partially covers the portion of the isolation structure 107 in the NMOS region 100B. The portions 144' of the PWF layer 144 in the NMOS region 100B are exposed through the second patterned mask 153.

Figures 2, 2O, 3:
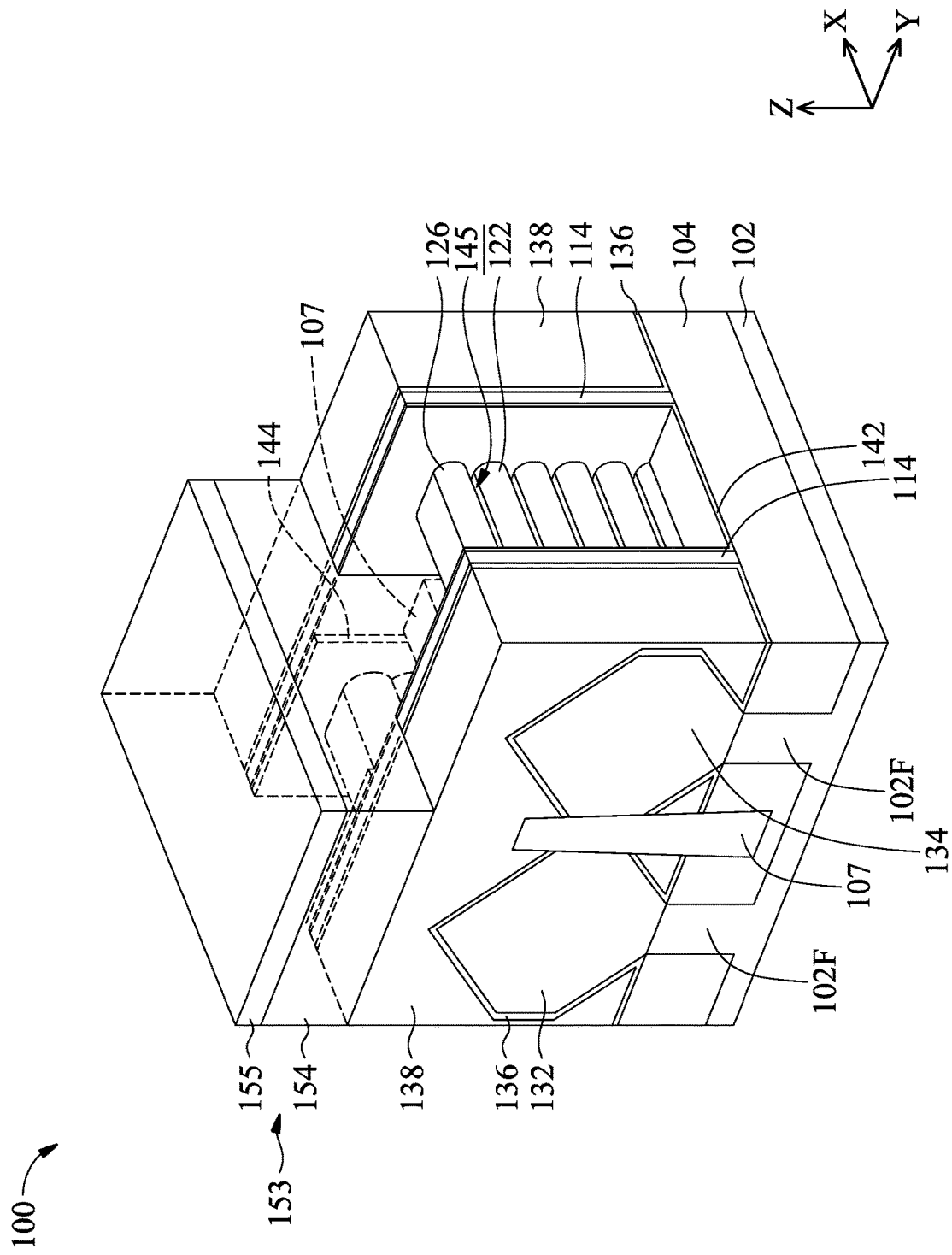
Figures 2, 2O, 3, 4:
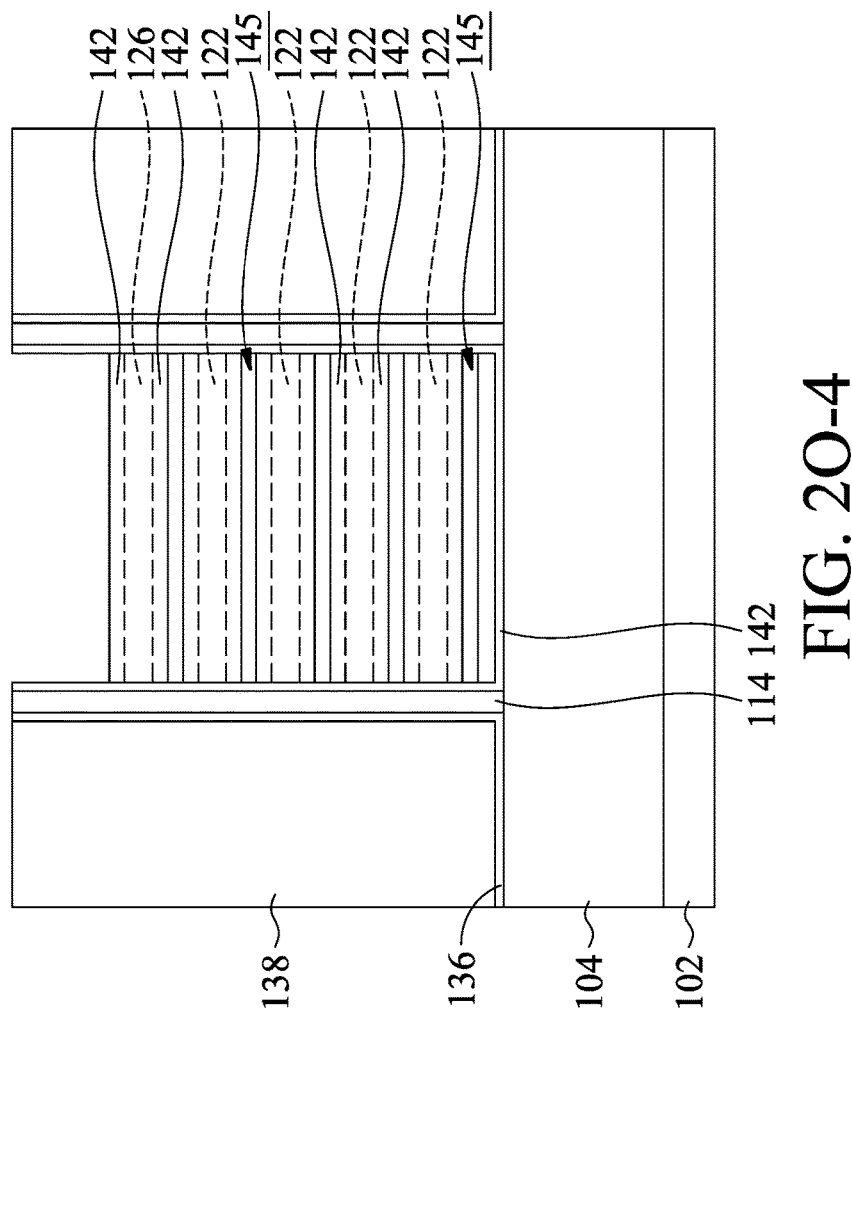

Next, referring to FIGS. 2O-1 and 2O-2, a second wet etching process 162 is performed on the area not covered with the second patterned mask 153 to remove the portions 144' of the PWF layer 144 in the NMOS region 100B, in accordance with some embodiments. The etching amount of the second wet etching process 162 is equal to or greater than half of the width W1 of the second hard mask 126 and the semiconductor layers 122 in the NMOS region 100B to remove the portions 144' of the PWF layer 144 in the NMOS region 100B. In some examples, the width W1 is in a range from about 100 Å to about 300 Å. The etching amount of the second wet etching process 162 is greater than that of the first wet etching process 160. The etchant solution used in the second wet etching process 162 may be the same as or similar to that of the first wet etching process 160. The etching amount of the second wet etching process 162 can be adjusted by etching time and temperature. Thereafter, the portions 144' of the PWF layer 144 in the NMOS region 100B are removed to form multiple spaces 145 between the neighboring semiconductor layers 122 and between the second hard mask 126 and the top semiconductor layer 122. The second patterned mask 153 can protect the PWF layer 144 in the PMOS region 100A and the boundary of the PWF layer 144 during the second wet etching process 162.

Meanwhile, FIG. 2O-3 shows a perspective view of the structure of FIGS. 2O-1 and 2O-2, and FIG. 2O-4 shows a front view of the structure of FIG. 2O-3 in accordance with some embodiments. The PWF layer 144, the first hard mask 124, the semiconductor layers 122 and the isolation structure 107 in the PMOS region 100A are covered with the second patterned mask 153. According to the embodiments of the disclosure, during the second wet etching process 162 with strong over etching to remove the portions 144' of the PWF layer 144 between the second semiconductor nanosheets in the NMOS region 100B, there is no lateral loss of the PWF layer 144 along the boundary $L_B$ since the wet etching path along the boundary $L_B$ has been cut-off by the second patterned mask 153.

Figures 1, 2P:
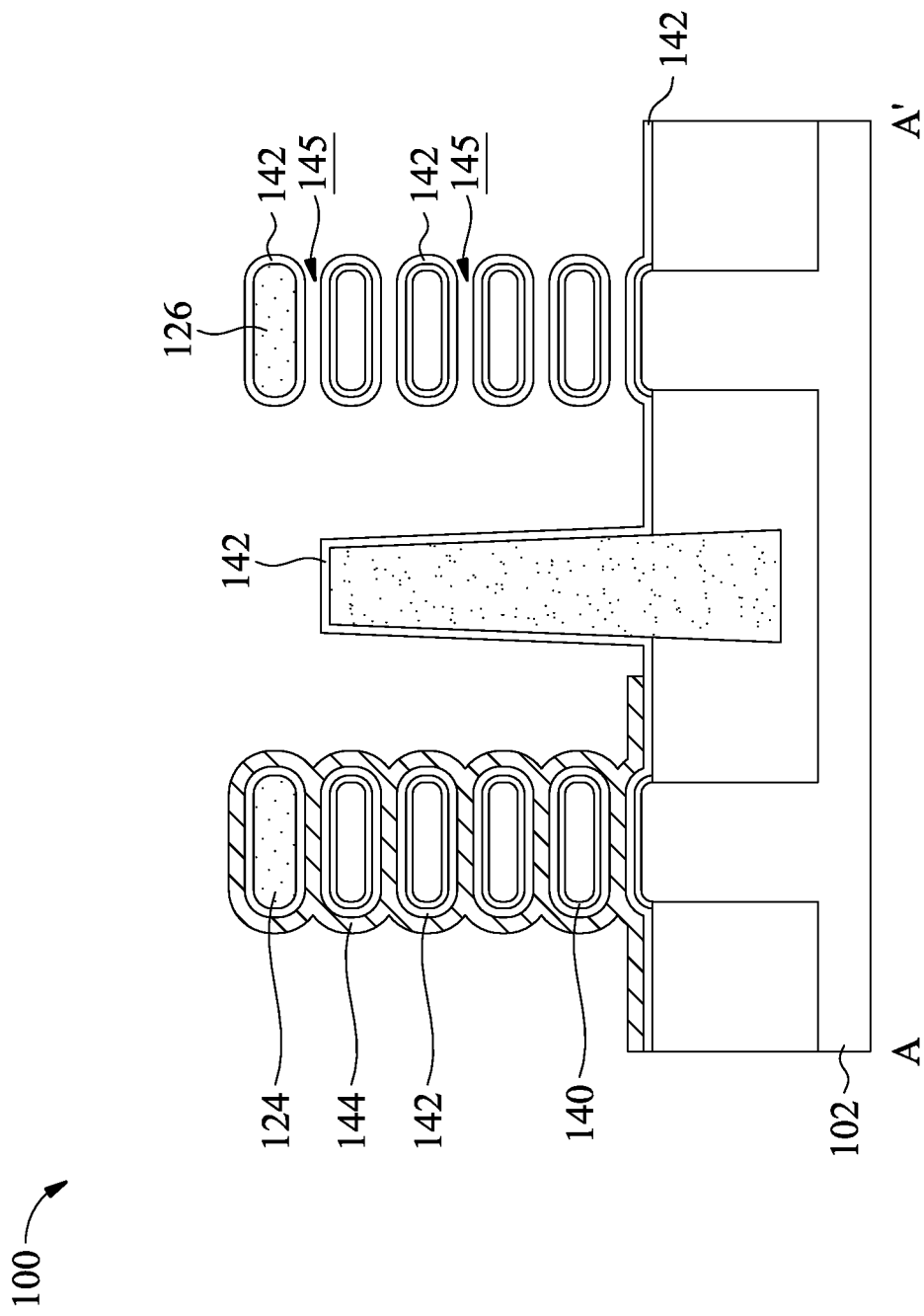
Figures 2, 2P:
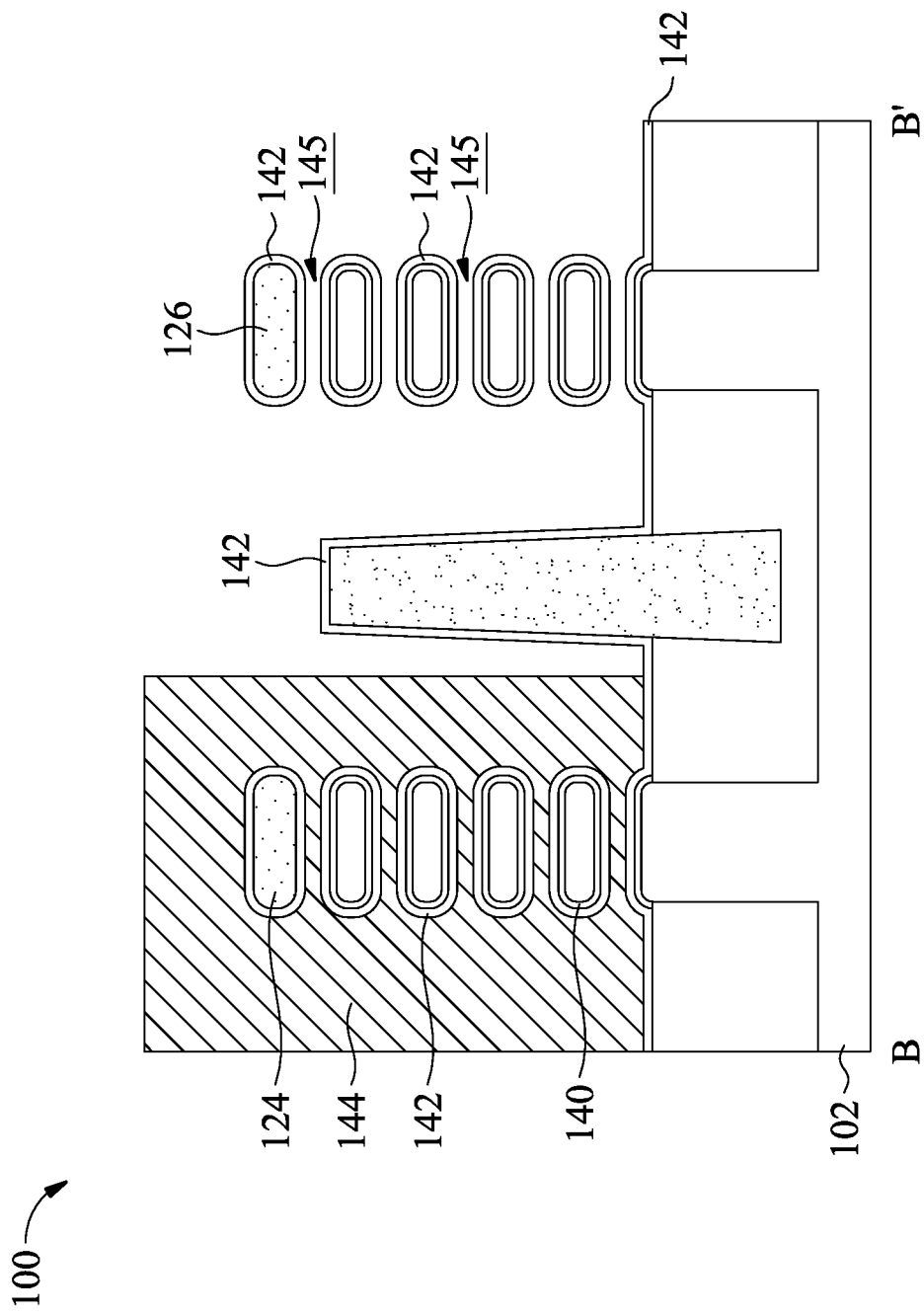
Figures 2, 2P, 3:
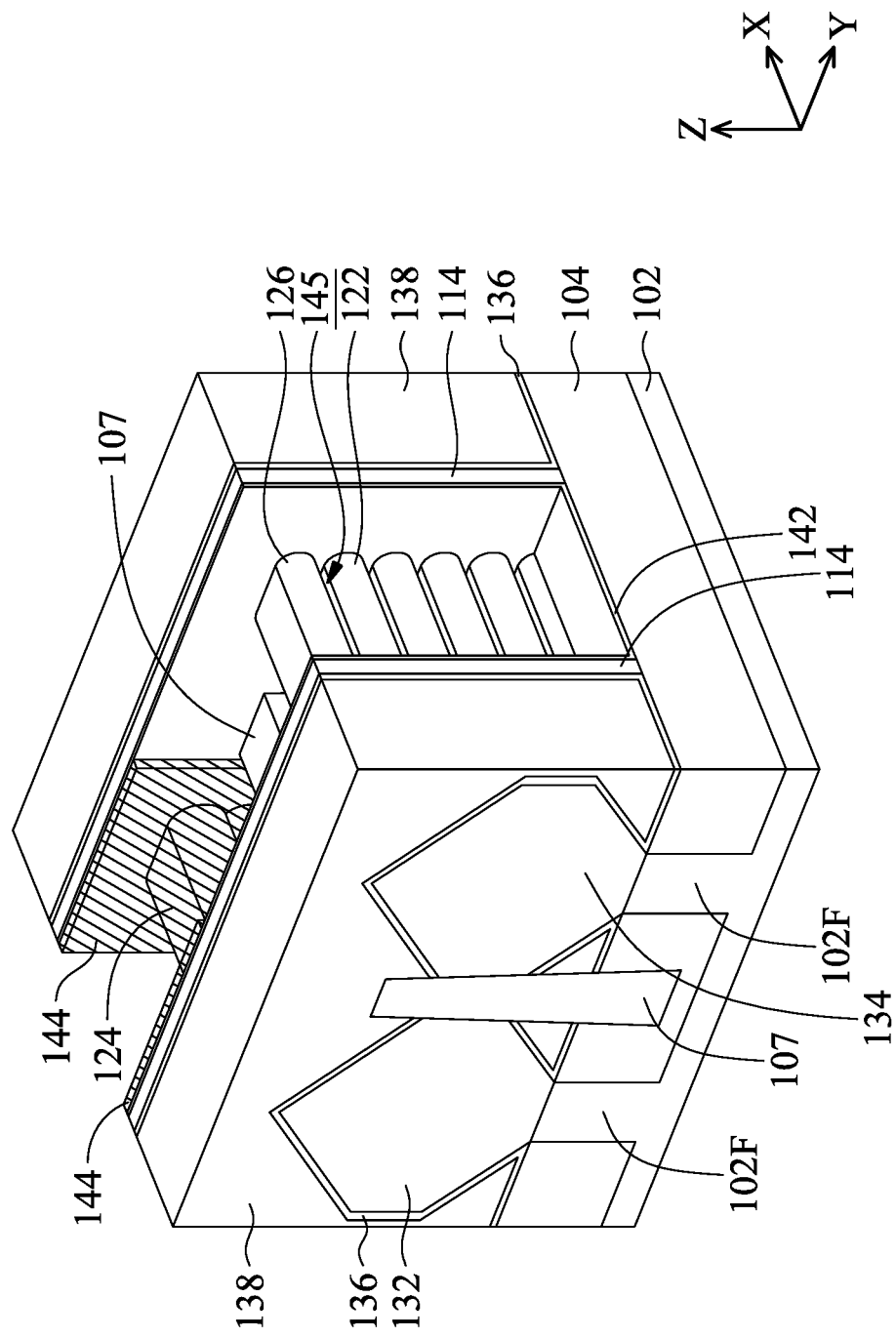

Next, referring to FIGS. 2P-1 and 2P-2, the second patterned mask 153 is removed in accordance with some embodiments. In some examples, the second patterned mask 153 is removed by an ashing process using $N_2$ and $H_2$. Thereafter, the PWF layer 144 in the PMOS region 100A is exposed. The boundary of the PWF layer 144 in the PMOS region 100A is back from the boundary $L_B$ between the PMOS region 100A and the NMOS region 100B. The gate dielectric layer 142 on the isolation structure 107 and surrounding the second hard mask 126 and the semiconductor layers 122 in the NMOS region 100B is also exposed. Meanwhile, FIG. 2P-3 shows a perspective view of the structure of FIGS. 2P-1 and 2P-2, in accordance with some embodiments. The structure of FIG. 2P-3 is similar to FIG. 2O-3 except the removal of the second patterned mask 153.

Figures 1, 2Q:
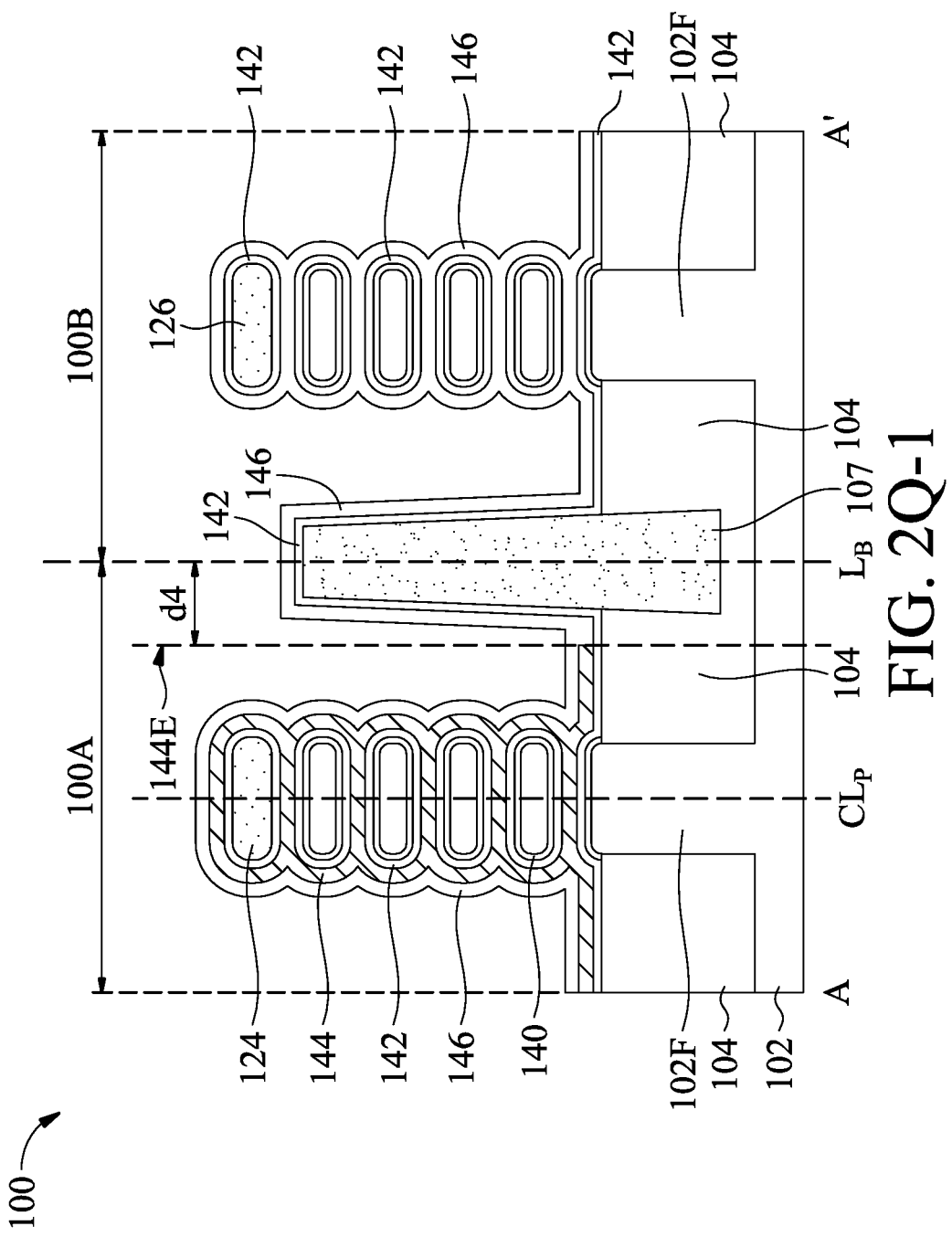
Figures 2, 2Q:
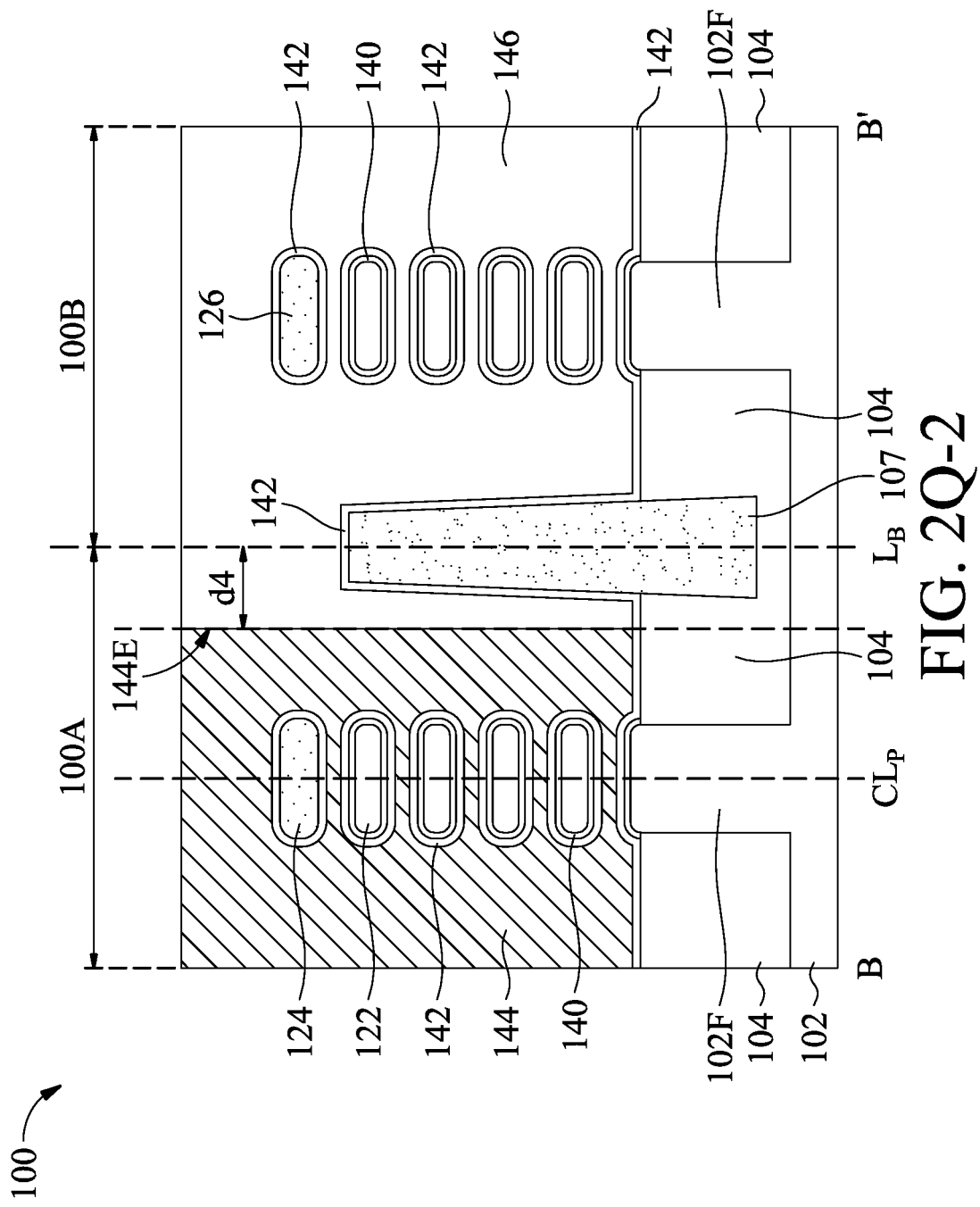

Next, referring to FIG. 2Q-1, an n-type work function (NWF) layer 146 is conformally deposited on the gate dielectric layer 142 and the PWF layer 144 in the PMOS region 100A and NMOS region 100B, in accordance with some embodiments. The NWF layer 146 surrounds the second hard mask 126 and the semiconductor layers 122 in the NMOS region 100B and to fill the spaces 145 (FIGS. 2P-1 and 2P-2). The NWF layer 146 is also formed on the gate dielectric layer 142 over the isolation structures 104 and 107. In addition, the NWF layer 146 is conformally deposited on the PWF layer 144 in the PMOS region 100A at the center line of the GAA structure. The NWF layer 146 includes TiAlC, TiAl, TaAlC, TaC, TaAlSiC or TiAlSiC and serves the Vt tuning of NMOS. The NWF layer 146 may be deposited by ALD process. In some examples, the NWF layer 146 has a thickness in a range from about 10 Å to about 30 Å.

Referring to FIG. 2Q-2, located at the sidewall of the GAA structure, the NWF layer 146 is deposited on the sidewall of the trench 139 (FIG. 2J-2) in the NMOS region 100B and over the boundary $L_B$ to be connected with the PWF layer 144, in accordance with some embodiments. The NWF layer 146 may stop at or over the boundary $L_B$ to completely or partially cover the isolation structure 107.

There is a distance d4 between an edge 144E of the PWF layer 144 and the boundary $L_B$. The semiconductor layers 122 in the PMOS region 100A may be referred to as first semiconductor nanosheets. The edge 144E of the PWF layer 144 is located between the first semiconductor nanosheets and the isolation structure 107. As described in FIGS. 2K-1 and 2K-2, the distance d1 is between the center line $CL_P$ of the first semiconductor nanosheets and the boundary $L_B$. According to some embodiments of the disclosure, the distance d4 is greater than 0 nm and shorter than or equal to half of the distance d1, i.e. 0 nm<d4≤(0.5×d1).

Figures 1, 2R:
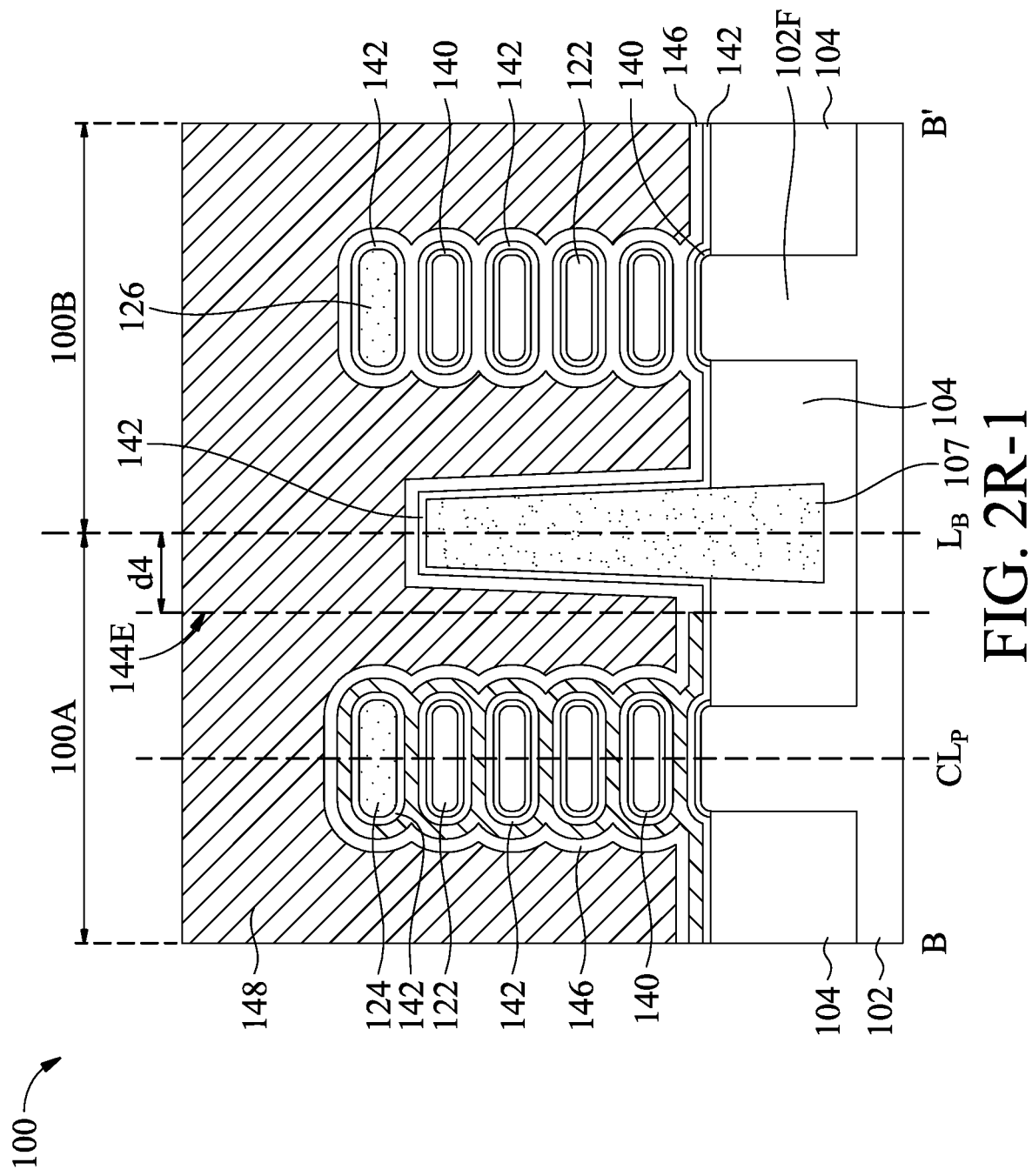
Figures 2, 2R:
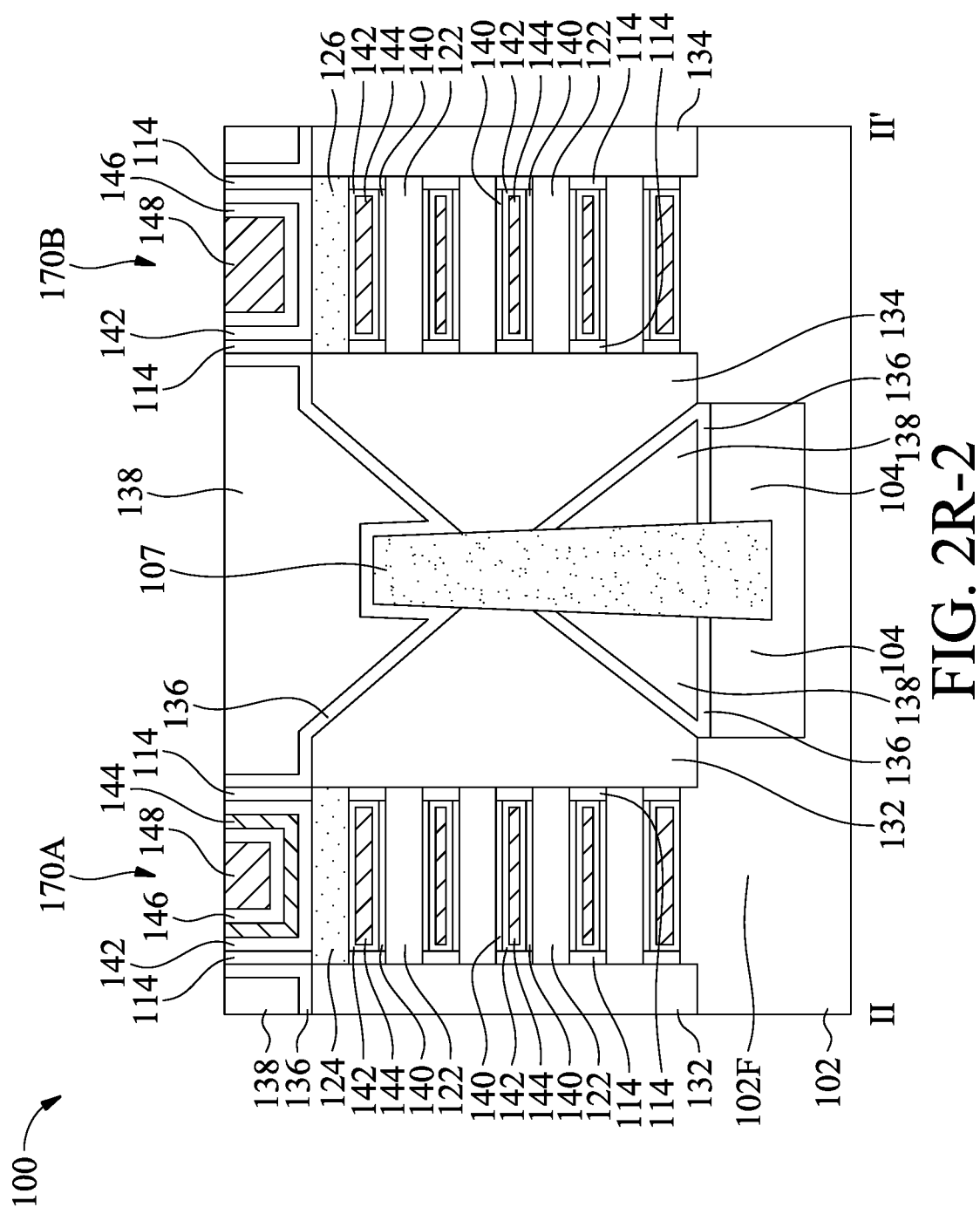

Afterwards, referring to FIG. 2R-1, a metal gate fill material 148 is formed on the NWF layer 146 in the PMOS region 100A and the NMOS region 100B to full fill the trench 139 (FIG. 2J-2), in accordance with some embodiments. The metal gate fill material 148 includes Co, W, Al, Ru, Cu, another suitable metal material or a combination thereof. The metal gate fill material 148 may be formed using a CVD and an electrochemical plating (ECP) processes.

Next, excess portions of the gate dielectric layer 142, the PWF layer 144, the NWF layer 146 and the metal gate fill material 148 deposited on the top surfaces of the ILD layer 138, the CESL 136 and the gate spacers 114 are removed in a planarization process such as a CMP process, as shown in FIG. 2R-2 in accordance with some embodiments. FIG. 2R-2 is a cross-sectional view of the semiconductor device 100 taken along line II-II' in FIG. 1, in accordance with some embodiments. Thereafter, a GAA structure 170A is formed in the PMOS region 100A, and a GAA structure 170B is formed in the NMOS region 100B. The top surface of the GAA structures 170A and 170B may be coplanar with the top surfaces of the ILD layer 138, the CESL 136 and the gate spacers 114. The GAA structures 170A and 170B are formed in a gate-last process with replacement gate structures to surround the semiconductor layers 122 that serve as channel regions of the semiconductor device 100.

In the GAA structure 170A, the spaces between the neighboring semiconductor layers 122 and the space between the first hard mask 124 and the top semiconductor layer 122 are filled with the interfacial layer (IL) 140, the gate dielectric layer 142 and the PWF layer 144. The trench between the gate spacers 114 above the first hard mask 124 is filled with the gate dielectric layer 142, the PWF layer 144, the NWF layer 146 and the metal gate fill material 148.

In the GAA structure 170B, the spaces between the neighboring semiconductor layers 122 and the space between the second hard mask 126 and the top semiconductor layer 122 are filled with the interfacial layer (IL) 140, the gate dielectric layer 142 and the NWF layer 146. The trench between the gate spacers 114 above the second hard mask 126 is filled with the gate dielectric layer 142, the NWF layer 146 and the metal gate fill material 148.

Afterwards, via contacts (not shown) to the source and drain structures 132 and the source and drain structures 134 are formed in the ILD layer 138. The via contacts are formed to pass through the CESL layer 136 and to be in contact with the respective source and drain structures 132 and the respective source and drain structures 134. The via contacts are formed by forming contact holes in the ILD layer 138 and the CESL layer 136 using photolithography and etching processes. The source and drain structures 132 and the source and drain structures 134 are exposed through the contact holes.

Thereafter, the contact holes are filled with a conductive material using a deposition process. The conductive material of the via contacts includes a metal, such as Co, W, Cu, Al, Au, Ag, alloys thereof, or a combination thereof, and may be deposited by CVD, ALD, PVD, or another deposition technique. Next, excess portion of the conductive material over the ILD layer 138 is removed in a planarization process, such as a CMP process, to form the via contacts. Moreover, in each of the contact holes, a liner may be conformally deposited on the sidewalls and the bottom surface of the contact hole before filling the contact hole with the conductive material. The liner may be used as a diffusion barrier layer, an adhesion layer, or a combination thereof. The material of the liner may include Ti, TiN, Ta, TaN, or the like. The liner may be deposited by ALD, PECVD, MBD, PVD, or another deposition technique. In addition, an anneal process may be performed to facilitate a reaction between some portions of the liner and the source and drain structures 132 and the source and drain structures 134 to form silicide regions at the respective source and drain structures 132 and the respective source and drain structures 134.

Afterwards, an additional ILD layer (not shown) is formed on the ILD layer 138 and the GAA structures 170A and 170B. Contacts to the GAA structures 170A and 170B are formed in and pass through the additional ILD layer. The materials and the processes for forming the contacts to the GAA structures 170A and 170B may be the same as or similar to those described above with respect to the via contacts to the source and drain structures 132 and the source and drain structures 134.

According to some embodiments of the disclosure, the semiconductor devices 100 are fabricated with excellent mixed Vts boundary isolation for multiple patterning gates. The embodiments of the disclosure provide a two-step patterning process and a two-step wet etching process to form multiple patterning gates such as the GAA structures 170A and 170B with excellent mixed Vts boundary isolation without metal gate material loss. The two-step patterning process uses the first patterned mask 150 in the PMOS region 100A and not over the boundary $L_B$ between the PMOS region 100A and the NMOS region 100B. The two-step patterning process further uses the second patterned mask 153 in the PMOS region 100A and over the boundary $L_B$ or at the boundary $L_B$. In addition, the two-step wet etching process uses the first wet etching process 160 and the second wet etching process 162 having different etching amounts to remove different portions of the PWF layer 144 in the NMOS region 100B and the PMOS region 100A. As a result, the PWF layer 144 in the PMOS region 100A has an edge that is back from the boundary $L_B$. The GAA structures 170A and 170B in the PMOS region 100A and the NMOS region 100B have excellent mixed Vts boundary isolation without metal gate material loss.

The embodiments of the disclosure can avoid metal gate loss and prevent from metal gate retreat along the boundary $L_B$ between the PMOS region 100A and the NMOS region 100B. Therefore, the embodiments of the disclosure can achieve high Vt in the PMOS region 100A, better Vt control in terms of Vt level and uniformity for the semiconductor devices 100 such as FinFET devices with nanowires or nanosheets for the GAA structures 170A and 170B while the device dimensions continuously shrink. Moreover, cell height budget of the semiconductor devices 100 can be saved due to minimized lateral loss of metal gate and excellent control in mixed Vts boundary.

According to the benefits mentioned above, the embodiments of the disclosure are suitable for semiconductor devices such as FinFET devices having GAA structures with mixed Vts boundary isolation at multiple technology nodes of 20 nm (N20), N16, N10, N7, N5, N3 and beyond. The mixed Vts boundary of the GAA structures of the semiconductor devices can be easily preserved for different device architectures. Moreover, in the semiconductor devices of the embodiments of the disclosure, better Vt control in terms of Vt level and uniformity can be achieved due to no metal gate loss. Therefore, the performance of the semiconductor devices is enhanced and the process window of forming GAA structures of the semiconductor devices can be enlarged.

In some embodiments, a method of fabricating a semiconductor device is provided. The method includes forming a plurality of first semiconductor nanosheets in a p-type device region and a plurality of second semiconductor nanosheets in an n-type device region, and forming an isolation structure between the p-type and n-type device regions. The method also includes depositing a gate dielectric layer and a p-type work function layer to surround each of the first semiconductor nanosheets and each of the second semiconductor nanosheets and on the isolation structure. The method further includes forming a first patterned mask on the p-type work function layer in the p-type device region, and etching the p-type work function layer in a first etching process using the first patterned mask as an etching mask to keep portions of the p-type work function layer between the second semiconductor nanosheets. The first patterned mask has a sidewall between the first semiconductor nanosheets and the boundary between the p-type and n-type device regions. In addition, the method includes forming a second patterned mask on the p-type work function layer in the p-type device region and over the isolation structure, and removing the portions of the p-type work function layer between the second semiconductor nanosheets in a second etching process. The method also includes depositing an n-type work function layer in the n-type and the p-type device regions to surround each of the second semiconductor nanosheets, over the isolation structure and on the p-type work function layer.

In some embodiments, a method of fabricating a semiconductor device is provided. The method includes depositing a stack of alternating first and second semiconductor layers over a substrate in a p-type device region and an n-type device region, and forming a first hard mask and a second hard mask on the stack and etching the stack to form a first fin structure in the p-type device region and a second fin structure in the n-type device region. The method also includes forming an isolation structure over the substrate at the boundary between the p-type and n-type device regions. The method further includes removing the first semiconductor layers of the first and second fin structures to form spaces between the second semiconductor layers. In addition, the method includes depositing a gate dielectric layer and a p-type work function layer to surround each of the second semiconductor layers and the first and second hard masks and to cover the isolation structure. The method also includes forming a first patterned mask in the p-type device region and etching the p-type work function layer in a first etching process to keep portions of the p-type work function layer between the second semiconductor layers in the n-type device region. The method further includes forming a second patterned mask in the p-type device region and on the isolation structure and removing the portions of the p-type work function layer between the second semiconductor layers in the n-type device region in a second etching process. In addition, the method includes depositing an n-type work function layer to surround the second semiconductor layers in the n-type device region and on the p-type work function layer in the p-type device region.

In some embodiments, a semiconductor device is provided. The semiconductor device includes a plurality of first semiconductor nanosheets spaced apart from each other and disposed in a p-type device region. The semiconductor device also includes a plurality of second semiconductor nanosheets spaced apart from each other and disposed in an n-type device region. The semiconductor device further includes an isolation structure disposed at the boundary between the p-type and n-type device regions. In addition, the semiconductor device includes a gate dielectric layer surrounding each of the first semiconductor nanosheets and each of the second semiconductor nanosheets and on the isolation structure. The semiconductor device also includes a p-type work function layer surrounding each of the first semiconductor nanosheets, and an n-type work function layer surrounding each of the second semiconductor nanosheets, over the isolation structure and on the p-type work function layer. The p-type work function layer has an edge located between the first semiconductor nanosheets and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a plurality of first semiconductor nanosheets in a p-type device region and a plurality of second semiconductor nanosheets in an n-type device region;
    forming an isolation structure between the p-type and n-type device regions;
    depositing a gate dielectric layer and a p-type work function layer to surround each of the first semiconductor nanosheets and each of the second semiconductor nanosheets and on the isolation structure;
    forming a first patterned mask on the p-type work function layer in the p-type device region, wherein the first patterned mask has a sidewall between the first semiconductor nanosheets and a boundary between the p-type and n-type device regions;
    etching the p-type work function layer in a first etching process using the first patterned mask as an etching mask to keep portions of the p-type work function layer between the second semiconductor nanosheets;
    forming a second patterned mask on the p-type work function layer in the p-type device region and over the isolation structure;
    removing the portions of the p-type work function layer between the second semiconductor nanosheets in a second etching process; and
    depositing an n-type work function layer in the n-type and the p-type device regions to surround each of the second semiconductor nanosheets, over the isolation structure and on the p-type work function layer wherein both the first and second patterned masks comprise a bottom anti-reflective coating (BARC) and a photoresist on the BARC, the BARC of the first patterned mask is in direct contact with the p-type work function layer, and the BARC of the second patterned mask is in direct contact with the p-type work function layer and the gate dielectric layer on the isolation structure.

2. The method as claimed in claim 1, wherein the first etching process comprises a first wet etching process, and an etching depth of the first wet etching process is equal to a thickness of the p-type work function layer.

3. The method as claimed in claim 1, further comprising removing the first patterned mask after the first etching process and before forming the second patterned mask.

4. The method as claimed in claim 1, wherein the second etching process comprises a second wet etching process, and an etching depth of the second wet etching process is equal to or greater than half of a width of the second semiconductor nanosheets.

5. The method as claimed in claim 1, wherein the first etching process has an etching depth that is less than an etching depth of the second etching process.

6. The method as claimed in claim 1, wherein there is a first distance between a center line of the first semiconductor nanosheets and the boundary between the p-type and n-type device regions, and there is a second distance between the sidewall of the first patterned mask and the boundary, and the second distance is greater than 0 nm and shorter than or equal to half of the first distance.

7. The method as claimed in claim 6, wherein there is a third distance between a sidewall of the second patterned mask and the boundary, and the third distance is greater than or equal to 0 nm and shorter than half of the first distance.

8. The method as claimed in claim 1, further comprising forming a metal gate fill material on the n-type work function layer in the p-type and n-type device regions to form a first gate-all-around (GAA) structure and a second GAA structure in the p-type and n-type device regions, respectively.

9. A method of fabricating a semiconductor device, comprising:
    depositing a stack of alternating first and second semiconductor layers over a substrate in a p-type device region and an n-type device region;
    forming a first hard mask and a second hard mask on the stack and etching the stack to form a first fin structure in the p-type device region and a second fin structure in the n-type device region;
    forming an isolation structure over the substrate at a boundary between the p-type and n-type device regions;
    removing the first semiconductor layers of the first and second fin structures to form a plurality of first semiconductor nanosheets in the p-type device region and a plurality of second semiconductor nanosheets in the n-type device region;
    depositing a gate dielectric layer and a p-type work function layer to surround each of the first semiconductor nanosheets, each of the second semiconductor nanosheets and the first and second hard masks and to cover the isolation structure;

forming a first patterned mask in the p-type device region and etching the p-type work function layer in a first etching process to keep portions of the p-type work function layer between the second semiconductor nanosheets;

forming a second patterned mask in the p-type device region and on the isolation structure and removing the portions of the p-type work function layer between the second semiconductor layers in the n-type device region in a second etching process; and depositing an n-type work function layer to surround the second semiconductor nanosheets and on the p-type work function layer in the p-type device region wherein both the first and second patterned masks comprise a bottom anti-reflective coating (BARC) and a photoresist on the BARC, the BARC of the first patterned mask is in direct contact with the p-type work function layer, and the BARC of the second patterned mask is in direct contact with the p-type work function layer and the gate dielectric layer on the isolation structure.

10. The method as claimed in claim 9, wherein the n-type work function layer further surrounds the second hard mask in the n-type device region and on the gate dielectric layer over the isolation structure.

11. The method as claimed in claim 9, further comprising forming a metal gate fill material on the n-type work function layer in the p-type and n-type device regions.

12. The method as claimed in claim 9, wherein the first and second etching processes comprise wet etching processes having different etching depths, and the second etching process has an etching depth greater than that of the first etching process.

13. The method as claimed in claim 9, wherein the first patterned mask has a sidewall between the first semiconductor nanosheets and the boundary, there is a first distance between a center line of the first semiconductor nanosheets and the boundary, and there is a second distance between the sidewall of the first patterned mask and the boundary, and the second distance is greater than 0 nm and shorter than or equal to half of the first distance.

14. The method as claimed in claim 13, wherein there is a third distance between a sidewall of the second patterned mask and the boundary, and the third distance is greater than or equal to 0 nm and shorter than half of the first distance.

15. A method of fabricating a semiconductor device, comprising:

forming a plurality of first semiconductor nanosheets in a p-type device region and a plurality of second semiconductor nanosheets in an n-type device region;

forming an isolation structure between the p-type and n-type device regions;

depositing a gate dielectric layer and a p-type work function layer to surround each of the first semiconductor nanosheets and each of the second semiconductor nanosheets and on the isolation structure;

forming a first patterned mask on the p-type work function layer in the p-type device region;

etching the p-type work function layer in a first etching process using the first patterned mask as an etching mask to remove portions of the p-type work function layer on the isolation structure and on outside surfaces of the second semiconductor nanosheets;

forming a second patterned mask on the p-type work function layer in the p-type device region and over the isolation structure, wherein the second patterned mask has a sidewall between the second semiconductor nanosheets and a boundary between the p-type and n-type device regions;

removing portions of the p-type work function layer between the second semiconductor nanosheets in a second etching process; and depositing an n-type work function layer in the n-type and the p-type device regions to surround each of the second semiconductor nanosheets, over the isolation structure and on the p-type work function layer wherein both the first and second patterned masks comprise a bottom anti-reflective coating (BARC) and a photoresist on the BARC, the BARC of the first patterned mask is in direct contact with the p-type work function layer, and the BARC of the second patterned mask is in direct contact with the p-type work function layer and the gate dielectric layer on the isolation structure.

16. The method as claimed in claim 15, wherein the p-type work function layer has an edge between the first semiconductor nanosheets and the isolation structure.

17. The method as claimed in claim 15, further comprising:

forming a metal gate fill material on the n-type work function layer in the p-type and n-type device regions and over the isolation structure;

forming first source and drain structures disposed on opposite sides of the first semiconductor nanosheets; and forming second source and drain structures disposed on opposite sides of the second semiconductor nanosheets, wherein the isolation structure is disposed between the first source and drain structures and the second source and drain structures.

18. The method as claimed in claim 17, further comprising:

forming a contact etch stop layer on the first source and drain structures, the second source and drain structures and the isolation structure; and forming an interlayer dielectric layer on the contact etch stop layer.

19. The method as claimed in claim 15, further comprising:

forming an interfacial layer to surround each of the first semiconductor nanosheets and each of the second semiconductor nanosheets before depositing the gate dielectric layer and the p-type work function layer.

20. The method as claimed in claim 15, wherein the first etching process comprises a first wet etching process, and an etching depth of the first wet etching process is equal to a thickness of the p-type work function layer.

* * * * *